United States Patent
Ogawa

(10) Patent No.: US 12,482,792 B2
(45) Date of Patent: Nov. 25, 2025

(54) DISPLAY DEVICE

(71) Applicant: Japan Display Inc., Tokyo (JP)

(72) Inventor: Akihiro Ogawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 529 days.

(21) Appl. No.: 17/895,075

(22) Filed: Aug. 25, 2022

(65) Prior Publication Data

US 2022/0406760 A1    Dec. 22, 2022

Related U.S. Application Data

(63) Continuation of application No. PCT/JP2021/001727, filed on Jan. 19, 2021.

(30) Foreign Application Priority Data

Feb. 27, 2020    (JP) .................................. 2020-031658

(51) Int. Cl.
*H01L 25/075* (2006.01)
*H10H 20/833* (2025.01)
*H10H 20/857* (2025.01)

(52) U.S. Cl.
CPC ....... *H01L 25/0753* (2013.01); *H10H 20/833* (2025.01); *H10H 20/857* (2025.01)

(58) Field of Classification Search
CPC . H01L 25/0753; H10H 20/833; H10H 20/857
See application file for complete search history.

(56) References Cited

U.S. PATENT DOCUMENTS 9,761,763 B2 * 9/2017 Steranka ............. H10H 20/851
10,090,335 B2   10/2018 Kang et al.
(Continued)

FOREIGN PATENT DOCUMENTS

CN    110190085 A    8/2019
JP    2017-3849 A    1/2017
(Continued)

OTHER PUBLICATIONS

Office Action issued Dec. 12, 2023 in Japanese Patent Application No. 2020-031658, 5 pages. (Submitting English translation only.).
(Continued)

*Primary Examiner* — Jeff W Natalini
*Assistant Examiner* — Andrew Zabel
(74) *Attorney, Agent, or Firm* — XSENSUS LLP

(57) ABSTRACT

A display device includes a circuit substrate including a first pixel and a second pixel, a first LED chip overlapping a first anode pad and a first cathode pad in the first pixel, and a second LED chip overlapping a second anode pad and a second cathode pad in the second pixel. The first pixel includes a first light transmission region overlapping the first LED chip, and is between the first anode pad and the first cathode pad. The second pixel includes a second light transmission region overlapping the second LED chip, and is between the second anode pad and the second cathode pad. In a plan view of the circuit substrate, a first area ($S_1$) of the first light transmission region and a second area ($S_2$) of the second light transmission region have a first ratio that is represented by $S_1:S_2=1:0.8$ to $1.2$.

2 Claims, 19 Drawing Sheets

(56) References Cited

U.S. PATENT DOCUMENTS

| | | | |
|---|---|---|---|
| 2011/0006302 A1* | 1/2011 | Yamazaki | H10D 86/441 |
| | | | 257/E29.296 |
| 2016/0365406 A1 | 12/2016 | Adachi et al. | |
| 2019/0129269 A1* | 5/2019 | Ogawa | G02F 1/133553 |
| 2020/0144458 A1* | 5/2020 | Lee | H10H 20/825 |
| 2020/0350361 A1 | 11/2020 | Tao et al. | |
| 2021/0104573 A1* | 4/2021 | Shan | C04B 35/624 |
| 2021/0134766 A1* | 5/2021 | Suich | H10H 20/822 |
| 2021/0167266 A1 | 6/2021 | Ikeda et al. | |
| 2021/0265282 A1 | 8/2021 | Li | |
| 2022/0069188 A1* | 3/2022 | Akimoto | H10H 20/84 |
| 2022/0158049 A1* | 5/2022 | Itou | G09F 9/33 |

FOREIGN PATENT DOCUMENTS

| | | | | | |
|---|---|---|---|---|---|
| JP | 2020071456 A | * | 5/2020 | | G09G 3/2003 |
| JP | 2020085944 A | * | 6/2020 | | H01L 25/0753 |

OTHER PUBLICATIONS

International Search Report and Written Opinion mailed on Apr. 13, 2021, received for PCT Application PCT/JP2021/001727, filed on Jan. 19, 2021, 16 pages including English Translation.

English machine translation of Chinese Office Action dated Feb. 13, 2025, issued in Chinese Application No. 202180013531.2, 9pp.

\* cited by examiner

DISPLAY DEVICE

CROSS-REFERENCE TO RELATED APPLICATIONS

This application is a Continuation of International Patent Application No. PCT/JP2021/001727, filed on Jan. 19, 2021, which claims the benefit of priority to Japanese Patent Application No. 2020-031658, filed on Feb. 27, 2020, the entire contents of which are incorporated herein by reference.

FIELD

One embodiment of the present invention relates to a display device, in particular, a display device using an LED chip.

BACKGROUND

In small and medium-sized displays such as smart phones, displays using a liquid crystal or an OLED (Organic Light Emitting Diode) have been commercialized. In particular, an OLED display using the OLED, which is a self-luminous element, has the advantages of high-contrast and no need for a backlight, as compared with a liquid crystal display. By using transparent conductive materials for the two electrodes (anode and cathode), the OLED can emit light on both sides (anode direction side and cathode direction side) while being transparent (see, for example, Japanese Patent Application Laid-Open Publication No. 2017-3889). However, since the OLED is composed of organic compounds, it is difficult to secure high reliability of the OLED display due to deterioration of the organic compounds.

In recent years, a so-called micro LED display device and mini LED display device in which a minute LED chip is mounted in each pixels of a circuit substrate has been developed as a next-generation display device (see, for example, U.S. Pat. No. 10,090,355 and Chinese Patent Application Lai-Open Publication No. 110190085). The LED is a self-luminous element similar to the OLED, but unlike OLED, the LED is composed of stable inorganic compounds containing gallium (Ga) or indium (In), and therefore, a highly reliable micro LED display device can be easily to secured as compared with the OLED display. In addition, since the LED chip has high emission efficiency, high brightness can be achieved. Therefore, the micro LED display device is expected as a next-generation display device with high reliability, high brightness, and high contrast.

SUMMARY

A display device according to an embodiment of the present invention includes a circuit substrate including a first pixel and a second pixel, a first LED chip overlapping a first anode pad and a first cathode pad in the first pixel, and a second LED chip overlapping a second anode pad and a second cathode pad in the second pixel. The first LED chip is mounted to be electrically connected with the first anode pad and the first cathode pad. The second LED chip is mounted to be electrically connected with the second anode pad and the second cathode pad. The first pixel includes a first light transmission region overlapping the first LED chip, is between the first anode pad and the first cathode pad, and is configured to transmit light emitted from the first LED chip. The second pixel includes a second light transmission region overlapping the second LED chip, is between the second anode pad and the second cathode pad, and is configured to transmit light emitted from the second LED chip. In a plan view of the circuit substrate, a first area ($S_1$) of the first light transmission region and a second area ($S_2$) of the second light transmission region have a first ratio. The first ratio is represented by $S_1:S_2=1:0.8$ to $1.2$.

A display device according to an embodiment of the present invention includes a circuit substrate and an LED chip. The circuit substrate includes a substrate, a light shielding layer over the substrate, a first insulating layer over the light shielding layer, a first wiring layer over the first insulating layer, a second insulating layer over the first wiring layer, an anode pad over the second insulating layer and electrically connected with the LED chip, and a cathode pad over the second insulating layer and electrically connected with the LED chip. In a plan view, the light shielding layer is located between the anode pad and the cathode.

DESCRIPTION OF EMBODIMENTS

Figure 1:
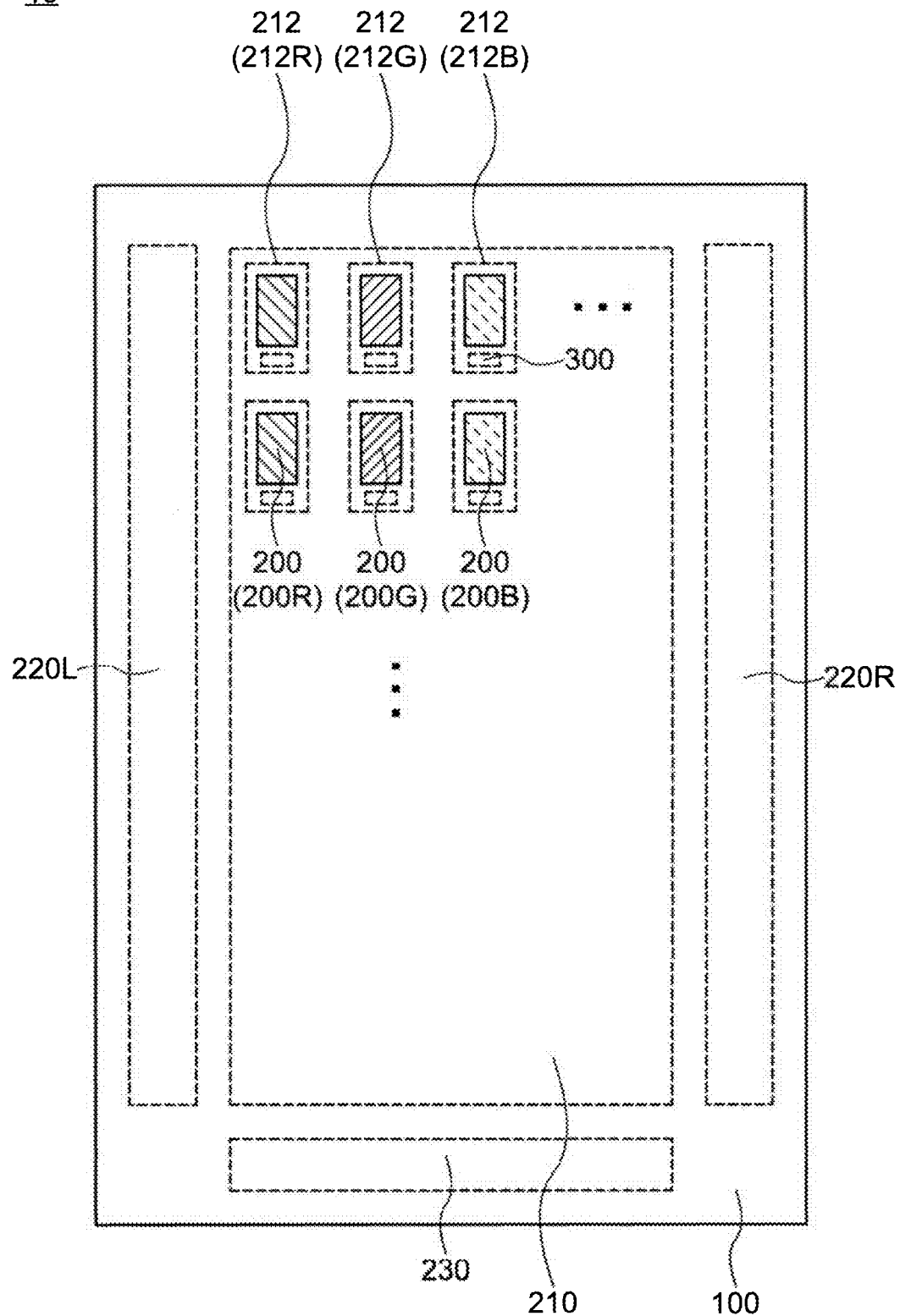
FIG. 1 is a schematic plan view of a display device according to an embodiment of the present invention.

A micro LED display device and mini LED display device can also be transparent and emit light on both sides by devising the structure of the LED or the mounting of the LED chip. However, in the case of the micro LED display device and the mini LED display device, since many wirings or electrodes are formed in the circuit substrate in which the LED chip is mounted, the brightness of the light emission obtained from the circuit substrate side of the LED chip is dependent on the arrangement of the wirings and the electrodes. That is, the brightness decreases when there are many wirings or electrodes in the area overlapping the LED chip, and increases when there are few wirings or electrodes in the area overlapping the LED chip. Therefore, when the light emission of the LED chip is extracted from the circuit substrate side, the brightness of each pixel varies depending on the arrangement of the pixels.

In view of the above problem, one of the objects of the present invention is to suppress variation in brightness between pixels in a display device in which an LED chip mounted over a circuit substrate emits light at least in a circuit substrate direction. In addition, one of the objects of the present invention is to provide a display device capable of displaying an excellent color balance in a display device in which LED chips of a plurality of emission colors are mounted.

Hereinafter, embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "α includes A, B or C", "α includes any of A, B and C", and "α includes one selected from the group consisting of A, B and C" do not exclude the case where α includes a plurality of combinations of A to C unless otherwise specified. Further, these expressions do not exclude the case where α includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a light emitting element over a substrate, one surface of the light emitting element in the direction facing the substrate is the bottom surface of the light emitting element and the other surface is the upper surface of the light emitting element. In addition, the expression of a light emitting element over a substrate only explains the vertical relationship between the substrate and the light emitting element, and another member may be placed between the substrate and the light emitting element. Furthermore, the terms "above" or "above direction" or "below" or "below direction" mean the order of stacked layers in the structure in which a plurality of layers are stacked, and may not be related to the position in which layers overlap in a plan view.

In this specification, "display device" is intended to include a wide range of devices that display a still image or moving images using the light emitting element, and may include not only a display panel and a display module but also a device to which other optical members (for example, a polarizing member or touch panel, etc.) are attached.

The following embodiments can be combined with each other as long as there is no technical contradiction.

First Embodiment

A display device 10 according to an embodiment of the present invention is described with reference to FIGS. 1 to 8C.

[1. Overview of Configuration of Display Device]

FIG. 1 is a schematic plan view of the display device 10 according to the embodiment of the present invention. Specifically, FIG. 1 is a block diagram illustrating a configuration of a planar layout of the display device 10.

As shown in FIG. 1, the display device 10 includes a circuit substrate 100 and a light emitting diode chip (LED chip) 200. The circuit substrate 100 includes a display portion 210, a first circuit portion 220L, a second circuit portion 220R, and a connection portion 230. The display portion 210 is provided in the central portion of the circuit substrate 100, and the first circuit portion 220L, the second circuit portion 220R, and the connection portion 230 are provided in the peripheral portion of the circuit substrate 100.

The display portion 210 includes a plurality of pixels 212. The LED chip 200 is mounted in each of the plurality of pixels 212. Further, each of the plurality of pixels 212 is provided with a transistor 300 for controlling the LED chip 200.

The LED chip 200 can emit light to at least the circuit substrate 100 side. That is, the light emitted from the LED chip 200 is extracted to the outside through the circuit substrate 100. The LED chip 200 may emit light not only in the circuit substrate 100 direction but also in the opposite direction to the circuit substrate 100. In this case, the display device 10 is a transparent LED display device capable of emitting light on both sides.

The emission colors of the plurality of LED chips 200 may be different. That is, in the display device 10, a first LED chip 200R, a second LED chip 200G, and a third LED chip 200B, which have different emission colors from each other, may be mounted in a first pixel 212R, a second pixel 212G, and a third pixel 212B, respectively. For example, the first LED chip 200R is a red LED chip, the second LED chip 200G is a green LED chip, and the third LED chip 200B is a blue LED chip. In this case, the display device 10 can perform full-color display by controlling the red light emission from the first LED chip 200R, the green light emission from the second LED chip 200G, and the blue light emission from the third LED chip 200B.

The size of the LED chip 200 is not particularly limited. The LED chip 200 may be appropriately selected in consideration of the size or resolution of the display device 10. For example, when the display device 10 is a small-sized or medium-sized display device, a mini LED chip or a micro LED chip can be used.

In the following description, when the emission color or the pixel is not particularly distinguished, the LED chip 200 or the pixel 212 is described.

The first circuit portion 220L and the second circuit portion 220R include a drive circuit for driving the transistor 300 included in the pixel. The drive circuit is, for example, a scanning line drive circuit (gate driver circuit) or a signal line drive circuit (source driver circuit). In FIG. 1, although two circuit portions of the first circuit portion 220L and the second circuit portion 220R are provided, the number of circuit portions may be one or three or more.

The connection portion 230 is connected to the first circuit portion 220L and the second circuit portion 220R by a connection wiring (not shown in FIG. 1). Further, the connection portion 230 is connected to an external device by a flexible printed circuit (FPC) or the like. That is, a signal from the external device is transmitted to the first circuit portion 220L and the second circuit portion 220R via the connection portion 230, which controls the transistor 300 of the pixel 212 of the display portion 210. Details of the control of the transistor 300 of the pixel 212 are described later.

Figure 2:
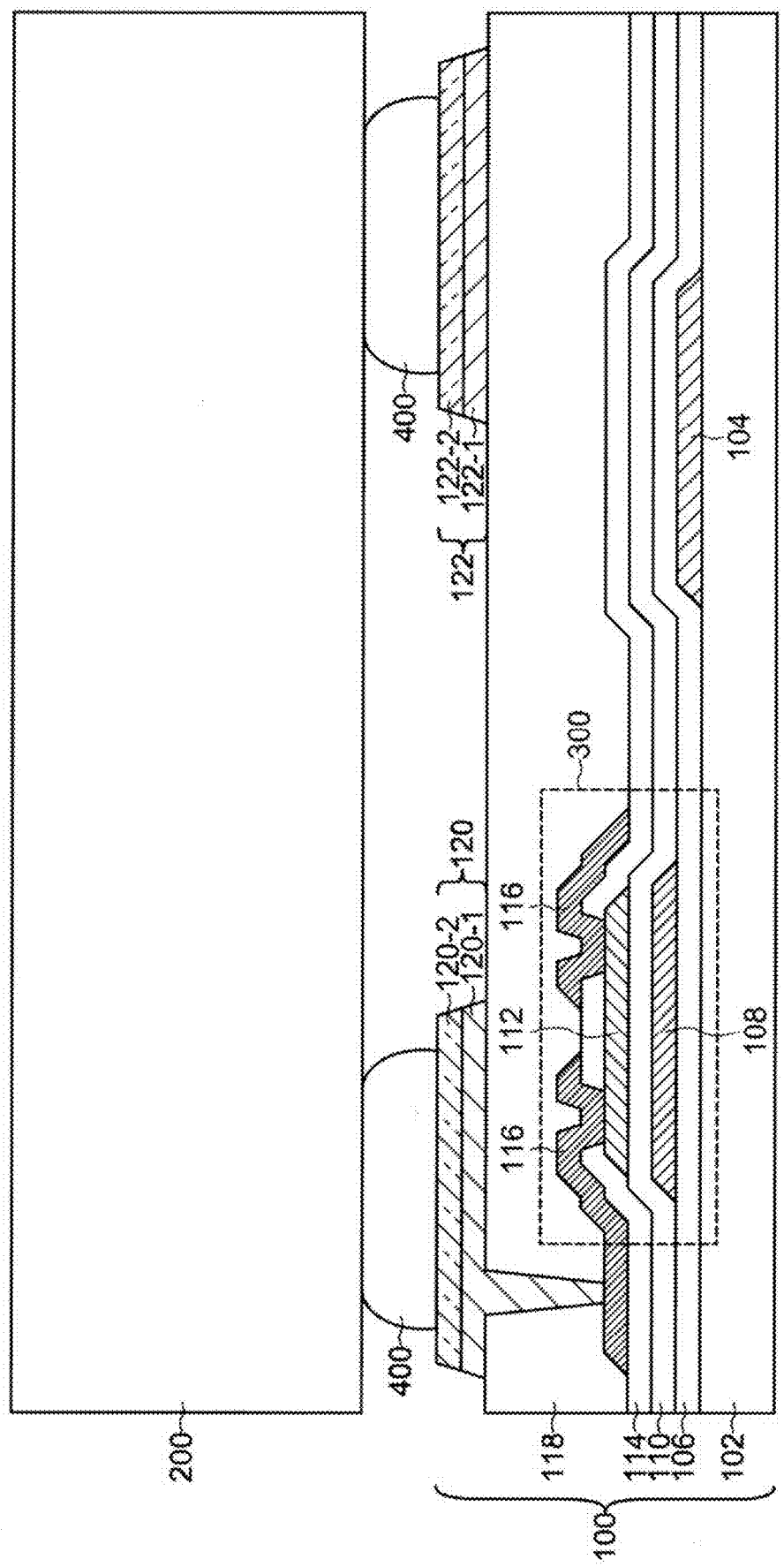
FIG. 2 is a schematic cross-sectional view of a pixel of a display device according to an embodiment of the present invention.

FIG. 2 is a schematic cross-sectional view of the pixel 212 of the display device 10 according to the embodiment of the present invention. Specifically, FIG. 2 is a cross-sectional view showing a configuration in which the LED chip 200 is mounted in the pixel 212 of the circuit substrate 100.

As shown in FIG. 2, the pixel 212 of the circuit substrate 100 includes a substrate 102, a light shielding layer 104, a first insulating layer 106, a first wiring layer 108, a second insulating layer 110, a semiconductor layer 112, a third insulating layer 114, a second wiring layer 116, a first flattening layer 118, an anode pad 120, and a cathode pad 122. The LED chip 200 is mounted on the anode pad 120 and the cathode pad 122 via an adhesive layer 400. Further, the LED chip 200 is electrically connected to the anode pad 120 and the cathode pad 122 via the adhesive layer 400. In other words, the LED chip 200 is flip-chip bonded on the circuit substrate 100.

The substrate 102 can support each layer provided over the substrate 102. The substrate 102 may be any substrate that can transmit light emitted from the LED chip 200. For example, a rigid substrate having translucency such as a glass substrate, a quartz substrate, or a sapphire substrate can be used as the substrate 102. Further, a flexible substrate having translucency such as a polyimide resin substrate, an acrylic resin substrate, a siloxane resin substrate, or a fluororesin substrate can be used as the substrate 102. Impurities may be introduced into the above resin substrate in order to improve the heat resistance of the substrate 102. A substrate in which a silicon oxide film or a silicon nitride film is formed on the rigid substrate or the flexible substrate can also be used as the substrate 102.

The light-shielding layer 104 can reflect or absorb light emitted from the LED chip 200 or external light. For example, aluminum (Al), copper (Cu), titanium (Ti), molybdenum (Mo) or tungsten (W), or an alloy or compound thereof can be used as the material of the light-shielding layer 104. Further, for example, a black matrix can be used as the material of the light-shielding layer 104. Furthermore, the light-shielding layer 104 may have a stacked structure as well as a single layer structure. For example, the light-shielding layer 104 may have a stacked structure of a red color filter, a green color filter, and a blue color filter.

The first insulating layer 106 can separate and insulate the light-shielding layer 104 and the first wiring layer 108. Further, by providing an opening in the first insulating layer 106, the light-shielding layer 104 can be electrically connected to the first wiring layer 108, the second wiring layer 116, the anode pad 120, or the cathode pad 122. For example, a silicon oxide film, a silicon nitride film, or a stacked film thereof can be used as the material of the first insulating layer 106.

The first wiring layer 108, the second insulating layer 110, the semiconductor layer 112, the third insulating layer 114, and the second wiring layer 116 can function as a part of the transistor 300. That is, the first wiring layer 108, the second insulating layer 110, the semiconductor layer 112, the third insulating layer 114, and the second wiring layer 116 can function as a gate electrode, a gate insulating film, a channel region, an interlayer insulating film, a source electrode and a drain electrode, respectively.

The transistor 300 shown in FIG. 2 is a bottom gate type transistor. The second insulating layer 110 (gate insulating film) is provided on the first wiring layer 108 (gate electrode). The semiconductor layer 112 (channel region) is provided on the second insulating layer 110 (gate insulating film). The third insulating layer 114 (interlayer insulating film) is provided on the semiconductor layer 112 (channel region). The second wiring layer 116 (source electrode or drain electrode) is provided on the third insulating layer 114 (interlayer insulating film). An opening is provided in the third insulating layer 114 (interlayer insulating film), and the second wiring layer 116 (source electrode or drain electrode) is in contact with the semiconductor layer 112 (semiconductor film) via the opening. One of the second wiring layers 116 in contact with the semiconductor layer 112 can function as the source electrode, and the other of the second wiring layers 116 can function as the drain electrode. The functions of the source electrode and the drain electrode may be interchanged.

A metal material can be used for each of the first wiring layer 108 and the second wiring layer 116. For example, copper (Cu), aluminum (Al), titanium (Ti), chromium (Cr), cobalt (Co), nickel (Ni), molybdenum (Mo), hafnium (Hf), tantalum (Ta), tungsten (W), or Bismus (Bi), or alloys or compounds thereof can be used as the metal material. Further, these metal materials may be stacked to form the first wiring layer 108 or the second wiring layer 116. The first wiring layer 108 or the second wiring layer 116 can be used not only as the gate electrode, the source electrode, or the drain electrode of the transistor 300, but also as a wiring for connecting a plurality of transistors 300.

An insulating material can be used for each of the second insulating layer 110 and the third insulating layer 114. For example, silicon oxide ($SiO_x$), silicon nitride ($SiO_xN_y$), silicon nitride ($SiN_x$), silicon nitride ($SiN_xO_y$), aluminum oxide ($AlO_x$), aluminum nitride ($AlO_xN_y$), and aluminum nitride oxide ($AlN_xO_y$), or inorganic insulators such as aluminum nitride ($AlN_x$) can be used as the insulating material. Here, $SiO_xN_y$ and $AlO_xN_y$ are respectively a silicon compound and an aluminum compound containing nitrogen (N) in a smaller amount than oxygen (O). Further, $SiN_xO_y$ and $AlN_xO_y$ are respective a silicon compound and an aluminum compound containing oxygen in a smaller amount than nitrogen. Further, each of the second insulating layer 110 and the third insulating layer 114 can use not only the inorganic insulating material as described above but also an organic insulating material. A polyimide resin, an acrylic resin, an epoxy resin, a silicone resin, a fluororesin, a siloxane resin, or the like can be used as the organic insulating material. In each of the second insulating layer 110 and the third insulating layer 114, the inorganic insulating layer material and the organic insulating material may be used alone, or these may be stacked.

A semiconductor material capable of forming a channel region can be used for the semiconductor layer 112. For example, an oxide semiconductor such as silicon, zinc oxide (IGZO) or zinc oxide (ZnO), or a compound semiconductor such as gallium arsenide (GaAs) or gallium arsenide (GaN) can be used as the semiconductor material. When the semiconductor material is silicon, it may be amorphous silicon, polysilicon, or single crystal silicon.

Although one transistor 300 is shown in FIG. 2, a plurality of transistors 300 are provided in the pixel 212. Further, the transistor 300 is not limited to the bottom gate type transistor. The transistor 300 may be a top gate type transistor.

The first flattening layer 118 can flatten the unevenness of the transistor 300. For example, an acrylic resin or a polyimide resin can be used as the material of the first flattening layer 118.

The anode pad 120 and the cathode pad 122 can function as electrode pads that are electrically connected to the LED chip 200. Although the anode pad 120 and the transistor 300 are electrically connected to each other in FIG. 2, the cathode pad 122 and the transistor 300 may also be electrically connected to each other.

The anode pad 120 and the cathode pad 122 preferably have a stacked structure. That is, the anode pad 120 includes a first electrode layer 120-1 and a second electrode layer 120-2, and the cathode pad 122 includes a third electrode layer 122-1 and a fourth electrode layer 122-2. The stacked structures of the anode pad 120 and the cathode pad 122 are not limited to two layers, and may be three or more layers.

For example, aluminum (Al), copper (Cu), titanium (Ti), molybdenum (Mo), or tungsten (W), or a metal material such as an alloy or compound thereof can be used as the material of the anode pad 120 and the cathode pad 122. Further, for example, a transparent conductive material such as indium tin oxide (ITO) or indium zinc oxide (IZO) can be used as the material of the anode pad 120 and the cathode pad 122.

When the anode pad 120 and the cathode pad 122 have a stacked structure, it is preferable that the second electrode layer 120-2 and the fourth electrode layer 120-4 using the transparent conductive material are provided on the first electrode layer 120-1 and the third electrode layer 122-1 using a metal material, respectively. By covering the surface of the metal material with the transparent conductive material, the surface of the metal material can be protected.

The adhesive layer 400 can electrically connect and bond the circuit substrate 100 and the LED chip 200. For example, silver paste or solder can be used as the adhesive layer 400. Further, an anisotropic conductive film (ACF) can also be used as the adhesive layer 400.

Although the LED chip 200 shown in FIG. 2 is mounted on the circuit substrate 100 by using flip chip bonding via the adhesive layer 400, the mounting of the LED chip 200 is not limited to this. The LED chip 200 may be mounted on the circuit substrate 100 by using wire bonding.

[2. Configuration of LED Chip]

In the display device 10, the LED chip 200 having a horizontal LED structure (horizontal electrode structure) is used. Therefore, in the following description, the LED chip 200 having the horizontal LED structure is described with reference to FIG. 3.

Figure 3:
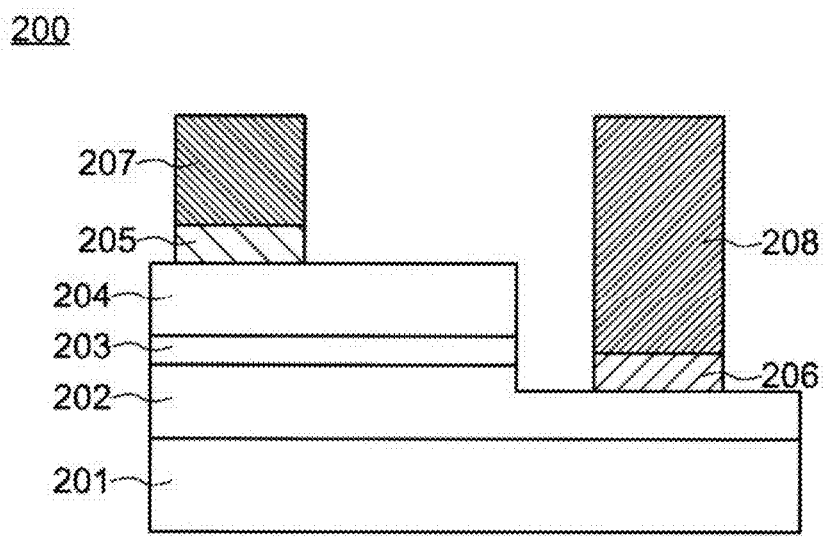
FIG. 3 is a schematic cross-sectional view of an LED chip mounted in a display device according to an embodiment of the present invention.

FIG. 3 is a schematic cross-sectional view of the LED chip 200 mounted on the display device 10 according to the embodiment of the present invention.

As shown in FIG. 3, the LED chip 200 includes a substrate 201, an n-type semiconductor layer 202, a light emitting layer 203, a p-type semiconductor layer 204, a p-type electrode 205, an n-type electrode 206, an anode bump 207, and a cathode bump 208.

The substrate 201 can support each layer provided over the substrate 201. Further, the substrate 201 is preferably a substrate on which the n-type semiconductor layer 202, the light emitting layer 203, and the p-type semiconductor layer 204 can be crystal-grown. For example, a sapphire substrate, a silicon carbide substrate, a gallium nitride substrate, or the like can be used as the substrate 201.

When the LED chip 200 is the red LED chip, the material constituting the light emitting layer 203 includes aluminum, gallium, indium, and phosphorus. Although the composition ratio of aluminum, gallium, and indium is typically aluminum:gallium:indium=0.225:0.275:0.5, the composition ratio is not limited to this. Further, each of the n-type semiconductor layer 202 and the p-type semiconductor layer is aluminum phosphide indium.

When the LED chip 200 is the green LED chip, the material constituting the light emitting layer 203 includes indium, gallium, and nitrogen. Although the composition ratio of indium to gallium is typically indium:gallium=0.44:0.55, the composition ratio is not limited to this. Further, each of the n-type semiconductor layer 202 and the p-type semiconductor layer is gallium nitride.

When the LED chip 200 is the blue LED chip, the material constituting the light emitting layer 203 includes indium, gallium, and nitrogen. The composition ratio of indium to gallium is typically indium:gallium=0.2:0.8, the composition ratio is not limited to this. Further, each of the n-type semiconductor layer 202 and the p-type semiconductor layer is gallium nitride.

Although aluminum can be used for the p-type electrode 205 and the n-type electrode 206 in any of the red LED chip, the green LED chip, and the blue LED chip, the p-type electrode 205 and the n-type electrode 206 are not limited to this.

The LED chip 200 crystal grows the n-type semiconductor layer 202, the light emitting layer 203, and the p-type semiconductor layer 204 over the substrate 201, and then forms the p-type electrode 205 and the n-type electrode 206. Further, the substrate 201 is diced and separated into individual LED chips 200.

The maximum emission wavelengths of the red LED chip, the green LED chip, and the blue LED chip are typically 645 nm, 530 nm, and 450 nm, respectively.

The anode bump 207 and the cathode bump 208 function as electrodes for connecting to the circuit substrate 100 and have a function for adjusting the height of the LED chip 200. That is, when the height of the surface of the p-type electrode 205 and the height of the surface of the n-type electrode 206 are different, the height of the LED chip 200 can be adjusted by using the anode bump 207 and the cathode bump 208. The anode bump 207 and the cathode bump 208 can be formed by plating, sputtering, vapor deposition, printing, or the like. When the anode bump 207 and the cathode bump 208 are formed by plating, for example, gold can be used as the material of the anode bump 207 and the cathode bump 208. However, the material of the anode bump 207 and the cathode bump 208 is not limited thereto.

The LED chip 200 crystal grows the n-type semiconductor layer 202, the light emitting layer 203, and the p-type semiconductor layer 204 over the substrate 201, and then forms the p-type electrode 205 and the n-type electrode 206. Subsequently, the anode bump 207 and the cathode bump 208 are formed on the p-type electrode 205 and the n-type electrode 206, respectively. Finally, the substrate 201 is diced and separated into individual LED chips 200.

The LED chip 200 is not limited to the configuration shown in FIG. 3. For example, the p-type electrode 205 and the n-type electrode 206 may be omitted, and the anode bump 207 and the cathode bump 208 may be formed on the p-type semiconductor layer 204 and the n-type semiconductor layer 202, respectively.

The LED chip 200 is not limited in size, and for example, the mini LED chip or the micro LED chip can be used as the LED chip 200.

[3. Configuration of Pixel]

The LED chip 200 is controlled by using the plurality of transistors 300 included in the pixel 212. Therefore, in the following description, the pixel circuit for driving the LED chip 200 is described with reference to FIG. 4.

Figure 4:
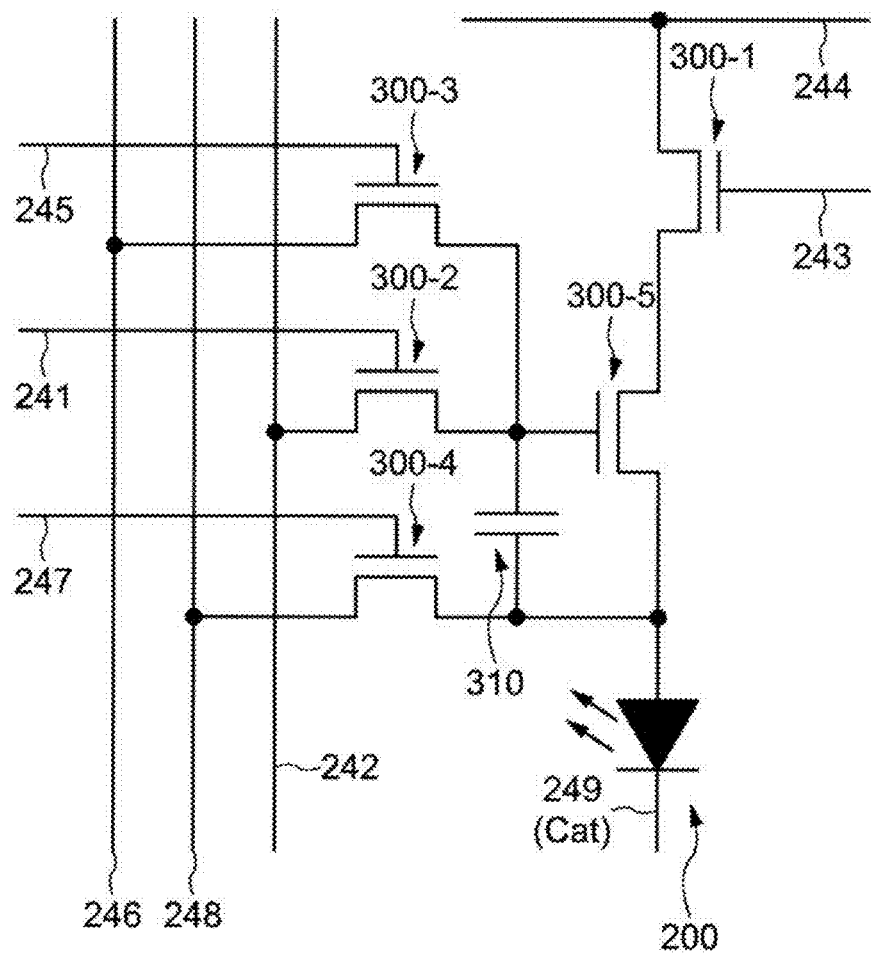
FIG. 4 is a circuit diagram showing a circuit (a pixel circuit) for driving an LED chip in a pixel of a display device according to an embodiment of the present invention.

FIG. 4 is a circuit diagram showing a circuit (pixel circuit) for driving the LED chip 200 in the pixel 212 of the display device 10 according to the embodiment of the present invention.

As shown in FIG. 4, the pixel circuit of the pixel 212 includes the LED chip 200, a first transistor 300-1, a second transistor 300-2, a third transistor 300-3, a fourth transistor 300-4, a fifth transistor 300-5, and a first capacitance element 310. Further, the pixel circuit of the pixel 212 includes a scanning line 241, a signal line 242, a light emission control scanning line 243, a current supply line 244, an initialization scanning line 245, an initialization line 246, a reset scanning line 247, a reset line 248, and a cathode wiring 249 (Cat).

The first transistor 300-1 is a light emission control transistor. The first transistor 300-1 is opened and closed by the light emission control scanning line 243, and selects whether or not to supply a current to the LED chip 200 and the fifth transistor 300-5.

The second transistor 300-2 is a selection transistor. The second transistor 300-2 is opened and closed by the scanning line 241 and applies a voltage supplied by the signal line 242 to a gate of the fifth transistor 300-5.

The third transistor 300-3 is an initialization transistor. The third transistor 300-3 is opened and closed by the initialization scanning line 245, and the gate of the fifth transistor 300-5 is fixed at a predetermined potential by using a voltage supplied by the initialization line 246.

The fourth transistor 300-4 is a reset transistor. The fourth transistor 300-4 is opened and closed by the reset scanning line 247, and the reverse bias voltage supplied by the reset line 248 is applied to the LED chip 200.

The fifth transistor 300-5 is a drive transistor. As described above the description, the potential of the gate of the fifth transistor 300-5 is determined based on the operation of the second transistor 300-2 or the third transistor 300-3, and a current having a value determined based on the potential of the gate is supplied from the current supply line 244 to the LED chip 200.

Here, an example of the layout of the pixel circuit shown in FIG. 4 is described with reference to FIG. 5.

Figure 5:
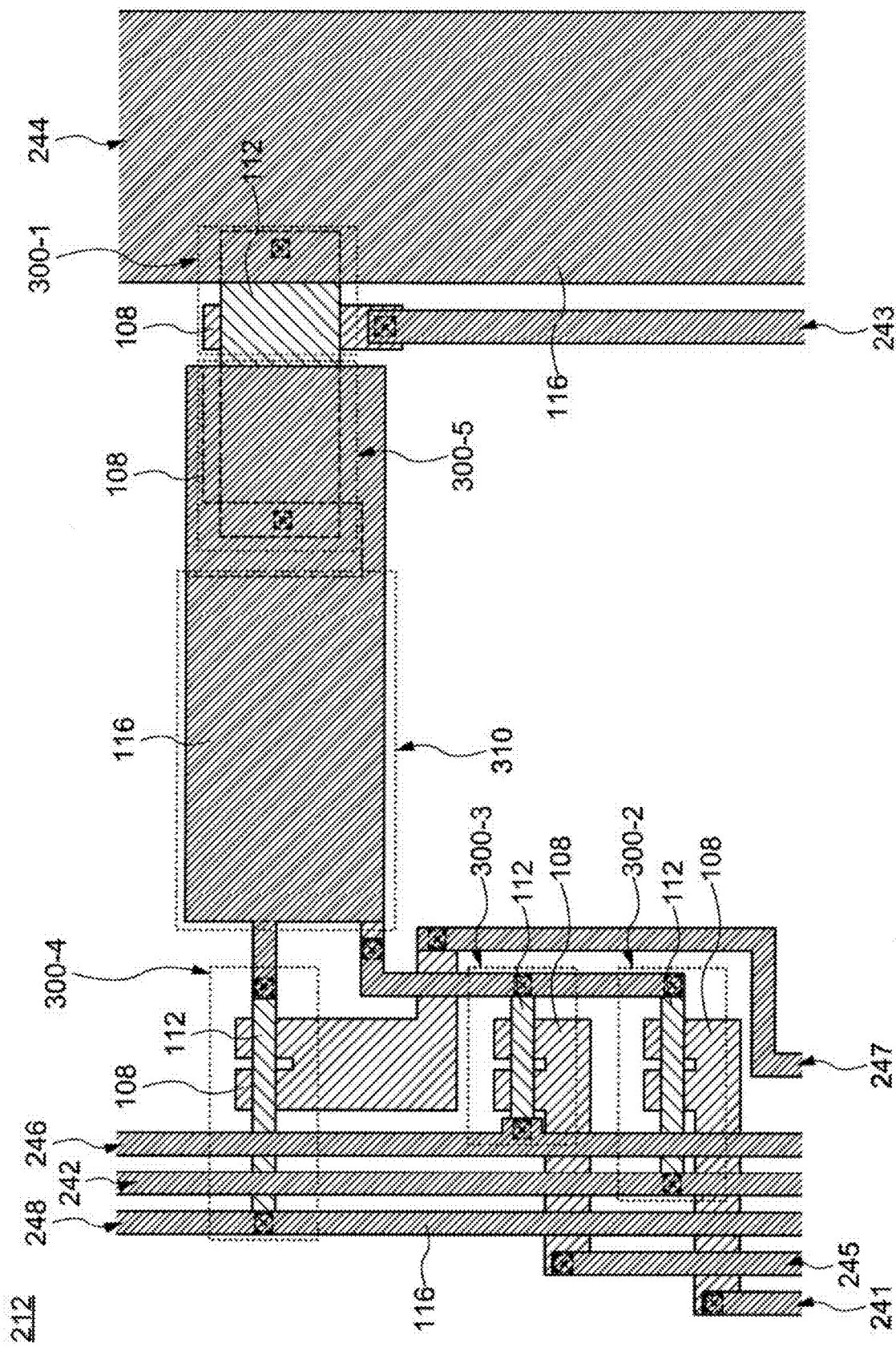
FIG. 5 is a schematic plan view of a pixel of a display device according to an embodiment of the present invention.

FIG. 5 is a schematic plan view of the pixel 212 of the display device 10 according to the embodiment of the present invention. Specifically, FIG. 5 shows a configuration of the pixel 212 on the circuit substrate 100 side. However, the anode pad 120 and the cathode pad 122 are omitted in order to make it easier to understand the connection relationship of each transistor 300. Further, in the connection of each layer, the overlapping portion of each layer may be connected via an opening. In FIG. 5, although the opening is shown as a rectangular shape, the shape of the opening may be a circular shape or an elliptical shape.

As shown in FIG. 5, the pixel 212 includes the first transistor 300-1, the second transistor 300-2, the third transistor 300-3, the fourth transistor 300-4, the fifth transistor 300-5, the first transistor, and the first capacitance element 310. Further, the pixel 212 also includes the scanning line 241, the signal line 242, the light emission control scanning line 243, the current supply line 244, the initialization scanning line 245, the initialization line 246, a reset scanning line 247, and the reset line 248.

Each of the first transistor 300-1, the second transistor 300-2, the third transistor 300-3, the fourth transistor 300-4, and the fifth transistor 300-5 includes the first wiring layer 108 functioning as a gate electrode and the semiconductor layer 112 forming a channel region. The first wiring layer 108 (dotted line portion) functioning as the gate electrode of the fifth transistor 300-5 is provided below the second wiring layer 116 and overlaps the second wiring layer 116.

The first capacitance element 310 includes the first wiring layer 108 and a second wiring layer 116 functioning as capacitance electrodes. The first wiring layer 108 (dotted line portion) functioning as the capacitance electrode of the first capacitance element 310 is also provided below the second wiring layer 116 and overlaps the second wiring layer 116.

Each of the scanning line 241, the signal line 242, the light emission control scanning line 243, the current supply line 244, the initialization scanning line 245, the initialization line 246, the reset scanning line 247, and the reset line 248 is mainly formed using the second wiring layer 116. The second wiring layer 116 is in contact with each semiconductor layer 112 overlapped via the opening.

Since a current that controls the brightness of the LED chip 200 flows through the current supply line 244, it is preferable that the width of the current supply line 244 formed of the second wiring layer 116 is larger than the widths of the other wirings. The light emission control scanning line 243 can be shared between adjacent pixels. In this case, it is preferable that the width of the light emission control scanning line 243 formed of the second wiring layer 116 is the second largest after the width of the current supply line 244 formed of the second wiring layer 116.

As shown by the third transistor 300-3 in FIG. 5, a portion is provided having a widened portion of the second wiring layer 116 which forms the initialization line 246, and an opening for connecting the wiring layer to the portion can also be formed.

[4. Configuration of Light Transmitting Region]

As shown in FIG. 5, the pixel 212 of the circuit substrate 100 includes many electrodes and wirings. Since most of the electrodes and the wirings are formed using a metal material, the electrodes and the wirings do not transmit the light emitted from the LED chip. Therefore, in order to extract the light emitted from the LED chip 200 in the circuit substrate 100 direction, it is necessary to provide the pixel 212 with a region (light transmitting region 500) capable of transmitting the light emitted from the LED chip 200 (for example, visible light). Therefore, the light transmitting region 500 in the circuit substrate 100 of the display device 10 is described with reference to FIGS. 6A to 6D.

FIGS. 6A to 6D are schematic plan views showing the positional relationship between the anode pad 120 and the cathode pad 122 of the circuit substrate 100 and the LED chip 200 in the display device 10 according to the embodiment of the present invention.

Figure 6A:
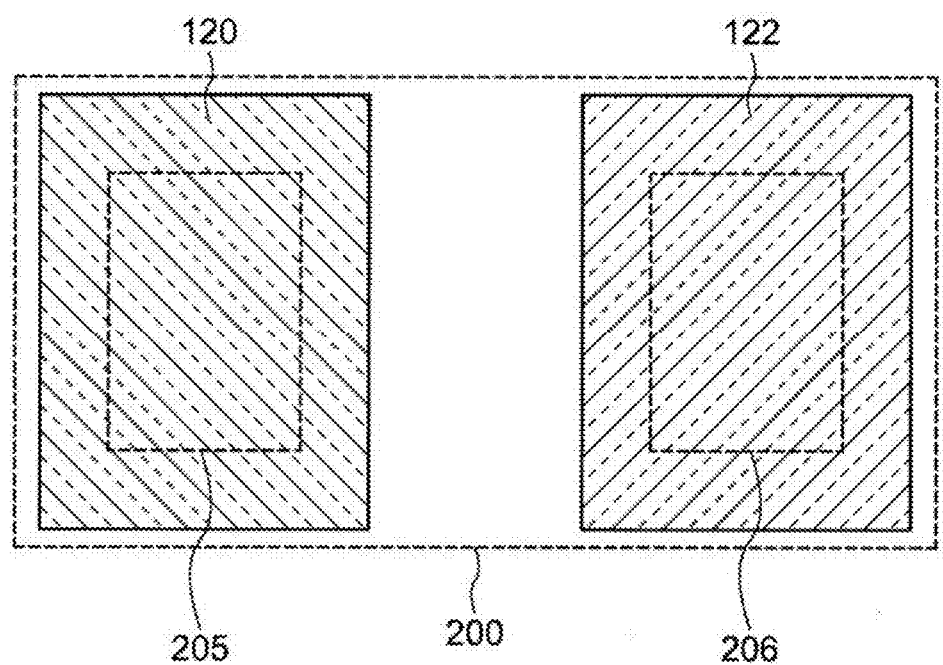
FIG. 6A is a schematic plan view showing a positional relationship between an anode pad and a cathode pad of a circuit substrate and an LED chip in a display device according to an embodiment of the present invention.

In FIG. 6A, the anode pad 120 and the cathode pad 122, which are included in the configuration of the circuit substrate 100 side, are shown by solid lines, and the LED chip 200 and the p-type electrode 205 and n-type electrode 206, which are included in the configuration of the LED chip 200, are shown by dotted lines. Further, in the configuration shown in FIG. 6A, the anode pad 120 and the p-type electrode 205 are electrically connected to each other, and the cathode pad 122 and the n-type electrode 206 are electrically connected to each other. When the anode pad 120 functions as a cathode pad and the cathode pad 122 functions as an anode pad, the electrical connection of the LED chip 200 may be reversed.

Figure 6B:
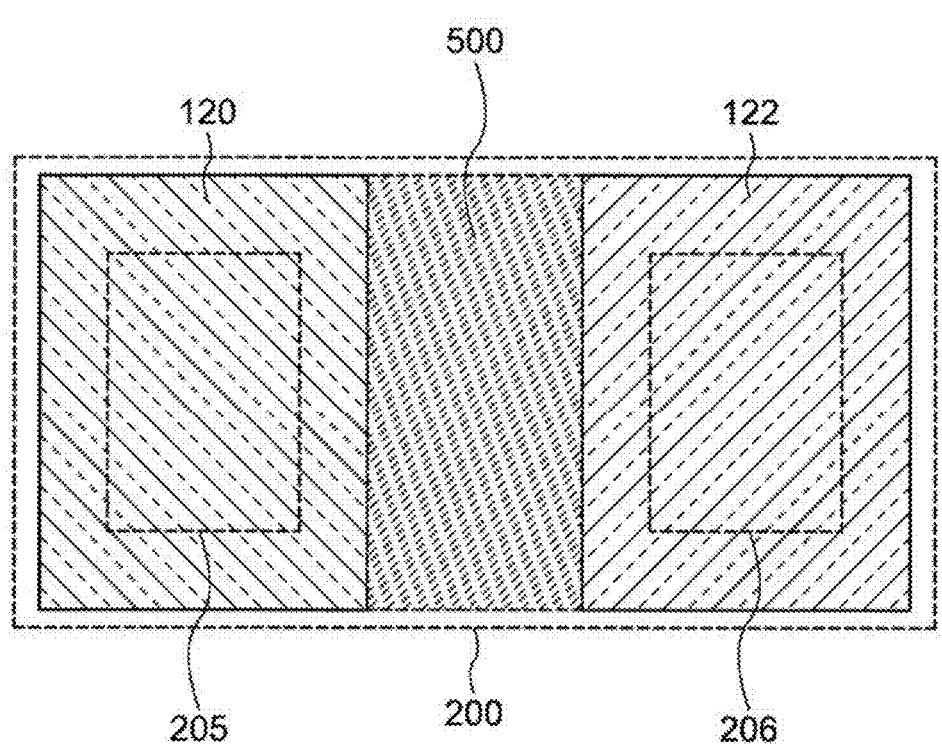
FIG. 6B is a schematic plan view showing a positional relationship between an anode pad and a cathode pad of a circuit substrate and an LED chip in a display device according to an embodiment of the present invention.

In the plan view of the circuit substrate 100 shown in FIG. 6B, a configuration is shown in the case where no electrode or wiring is present between the anode pad 120 and the cathode pad 122. Although the light emitted from the LED chip 200 is shielded by the anode pad 120 and the cathode pad 122, the light can be transmitted in a region between the anode pad 120 and the cathode pad 122. In reality, since there is a space between the circuit substrate 100 and the LED chip 200, it is considered that the light emitted from the LED chip 200 also passes through the peripheral region of the anode pad 120 or the cathode pad 122. In the present specification, as shown in FIG. 6B, a region that overlaps the LED chip 200 and is located between the anode pad 120 and the cathode pad 122, which transmits light emitted from the LED chip 200, is defined as a light transmitting region 500.

Figure 6C:
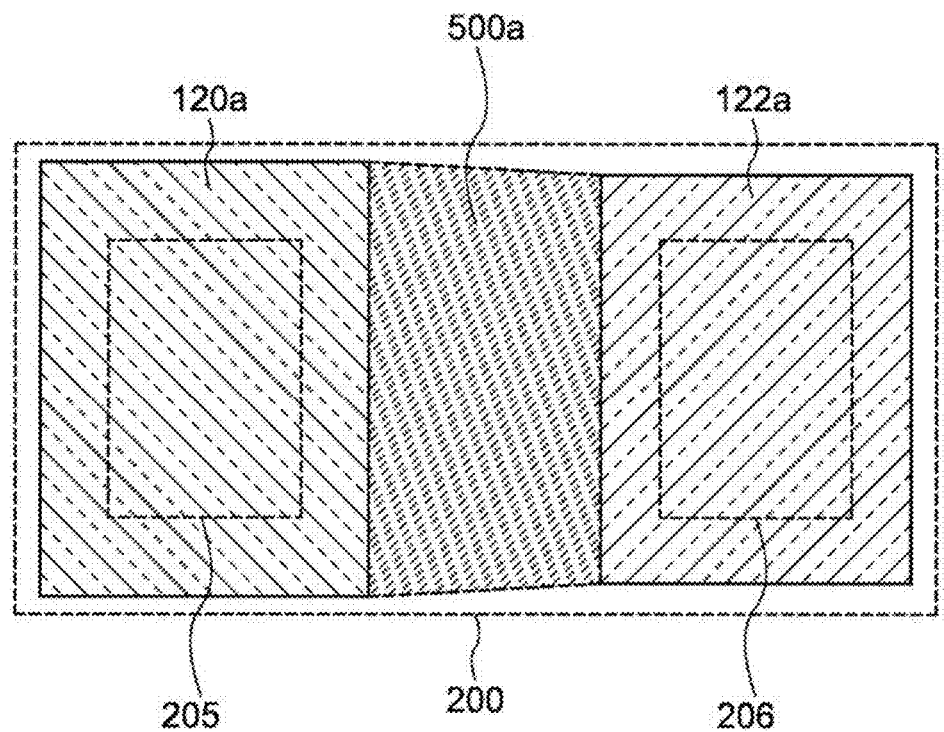
FIG. 6C is a schematic plan view showing a positional relationship between an anode pad and a cathode pad of a circuit substrate and an LED chip in a display device according to an embodiment of the present invention.

FIG. 6C is an example in which the shape of the anode pad 120a and the shape of the cathode pad 122a are different. In FIG. 6C, there is no electrode or wiring between the anode pad 120a and the cathode pad 122a. In this case, as shown in FIG. 6C, a region that overlaps the LED chip 200 and is located between the anode pad 120a and the cathode pad 122a, which transmits light emitted from the LED chip 200, is also defined as a light transmitting region 500a. Specifically, the light transmitting region 500a is a region surrounded by two opposite sides of the anode pad 120a and the cathode pad 122a and two lines connecting the two sides.

Figure 6D:
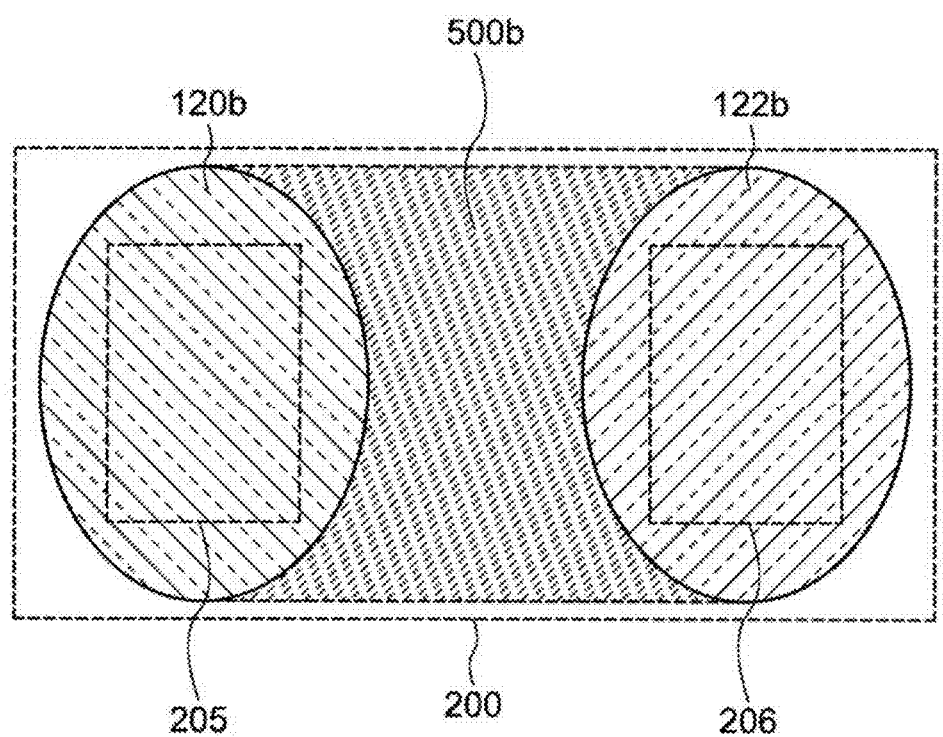
FIG. 6D is a schematic plan view showing a positional relationship between an anode pad and a cathode pad of a circuit substrate and an LED chip in a display device according to an embodiment of the present invention.

FIG. 6D is an example in the case of the anode pad 120b and the cathode pad 122b having a curved shape. In FIG. 6D, there is no electrode or wiring between the anode pad 120b and the cathode pad 122b. In this case, as shown in FIG. 6D, a region that overlaps the LED chip 200 and is located between the anode pad 120b and the cathode pad 122b, which transmits light emitted from the LED chip 200, is also defined as a light transmission region 500b. Specifically, the light transmission region 500b is a region surrounded by the curve of the anode pad 120b, the curve of the cathode pad 122b, and the two tangents of the anode pad 120b and the cathode pad 122b.

In practice, as shown in FIG. 5, the pixel 212 of the circuit substrate 100 includes many electrodes and wirings. In the display device 10 according to the present embodiment, by using these electrodes or wirings as the light shielding film, the area of the light transmitting region 500 is adjusted, and the brightness of the light transmitted through the circuit substrate 100 is adjusted. Therefore, in the following description, the adjustment of the area of the light transmitting region 500 is described with reference to FIGS. 7A to 7D.

FIGS. 7A to 7D are schematic plan views showing the light transmission region 500 with an adjusted area in the display device 10 according to the embodiment of the present invention.

Figure 7A:
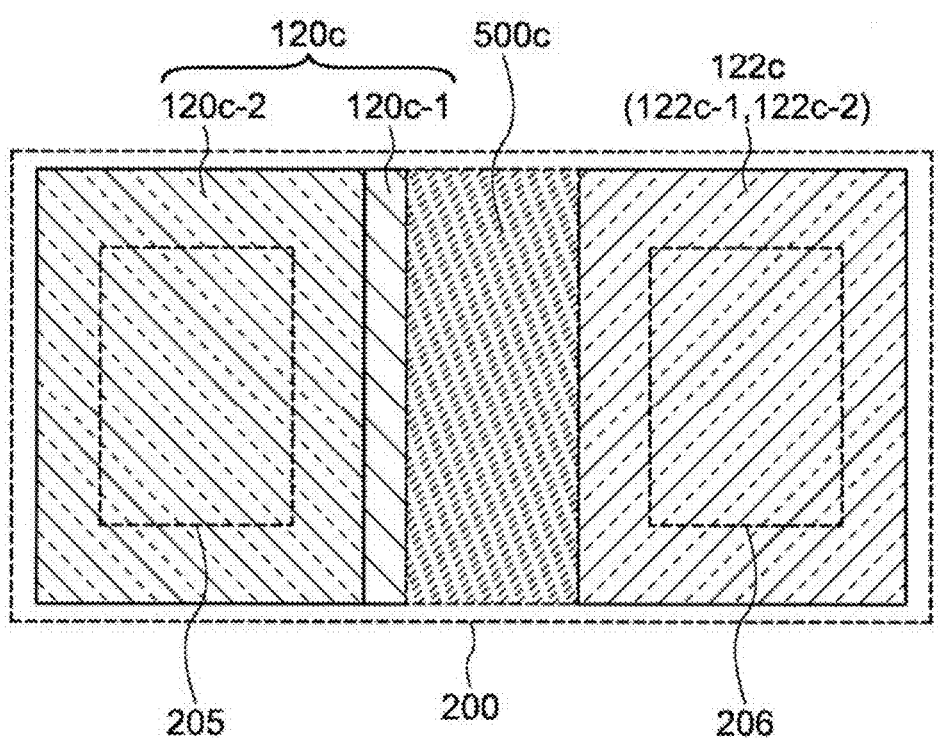
FIG. 7A is a schematic plan view showing a light transmission region with an adjusted area in a display device according to an embodiment of the present invention.

In FIG. 7A, an anode pad 120c includes a first electrode layer 120c-1 and a second electrode layer 120c-2, and a cathode pad 122c includes a third electrode layer 122c-1 and a fourth electrode layer 122c-2. The first electrode layer 120c-1 is larger than the second electrode layer 120c-2 and includes a portion (protruding portion) protruding in the direction of the cathode pad 122c from an end portion of the second electrode layer 120c-2.

The area of the light transmitting region 500c can be adjusted by the protruding portion of the first electrode layer 120c-1. That is, the area of the light transmitting region 500c can be reduced by increasing the protruding portion of the first electrode layer 120c-1. Further, the area of the light transmitting region 500c can be increased by reducing the protruding portion of the first electrode layer 120c-1. The area of the light transmission region 500c may be adjusted by the cathode pad 122c instead of the anode pad 120c. That is, the third electrode layer 122c-1 may be larger than the fourth electrode layer 122c-2 and includes a portion (protruding portion) protruding in the direction of the anode pad 120c from an end portion of the fourth electrode layer 122c-2.

Figure 7B:
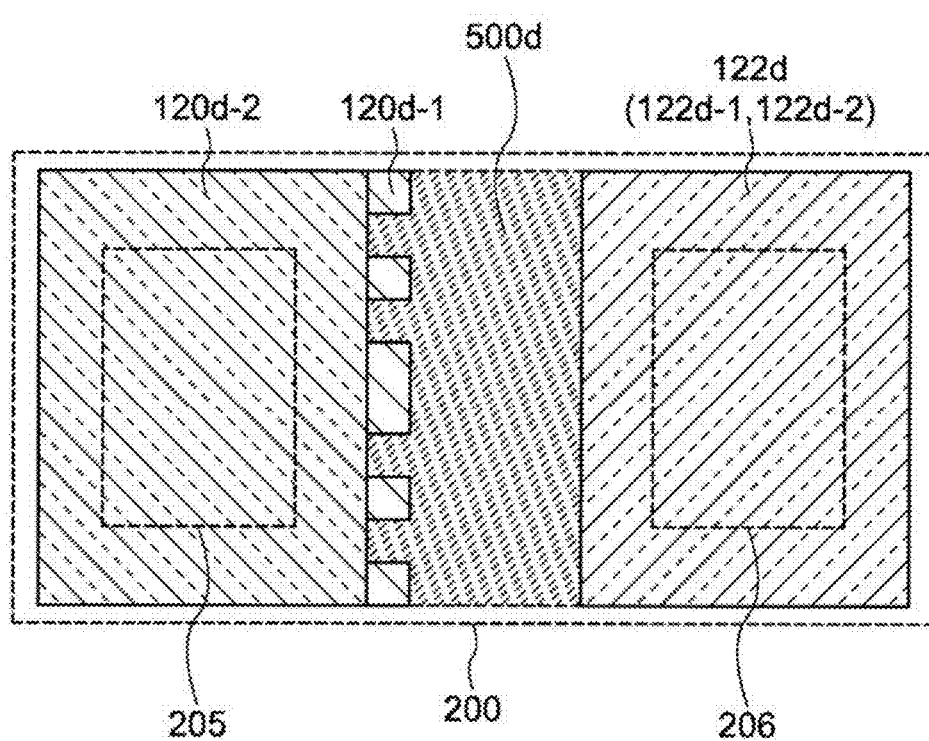
FIG. 7B is a schematic plan view showing a light transmission region with an adjusted area in a display device according to an embodiment of the present invention.

In FIG. 7B, an anode pad 120d includes a first electrode layer 120d-1 and a second electrode layer 120d-2, and a cathode pad 122d includes a third electrode layer 122d-1 and a fourth electrode layer 122d-2. The first electrode layer 120d-1 is larger than the second electrode layer 120d-2 and includes a portion (protruding portion) protruding in the direction of the cathode pad 122d from an end portion of the second electrode layer 120d-2. Further, the protruding portion of the first electrode layer 120c-1 is formed in an uneven shape.

The area of the light transmitting region 500d can be adjusted by changing the sizes of concave and convex portions which are formed in the protruding portion of the first electrode layer 120d-1. That is, the area of the light transmitting region 500d can be reduced by increasing the concave portions of the protruding portion of the first electrode layer 120d-1. Further, the area of the transmitting region 500d can be increased by reducing the convex portions of the protruding portion of the first electrode layer 120d-1.

Figure 7C:
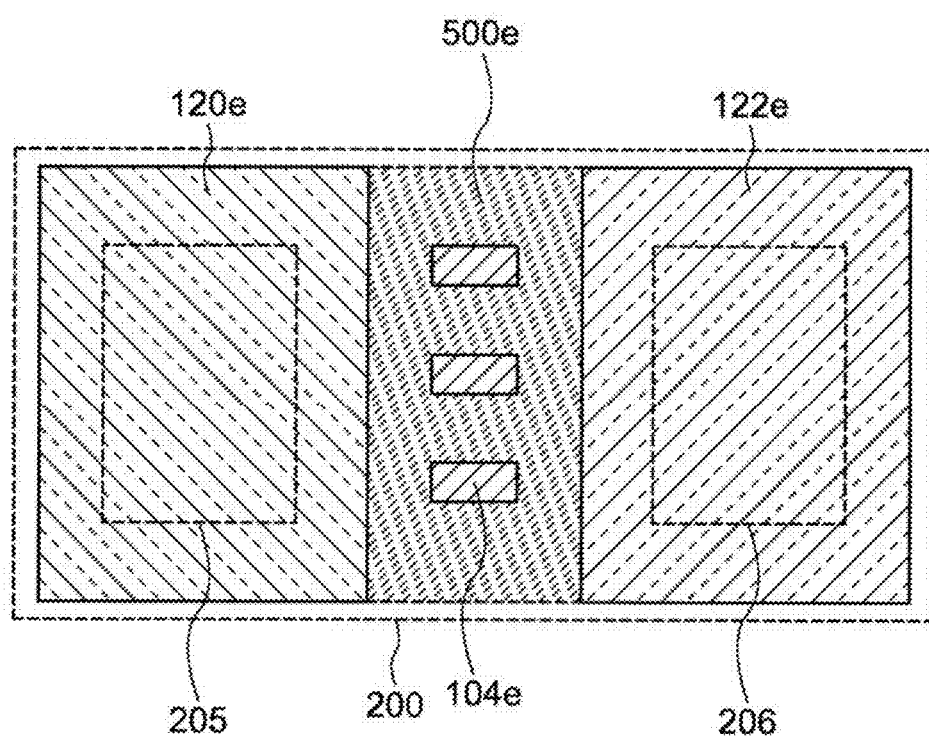
FIG. 7C is a schematic plan view showing a light transmission region with an adjusted area in a display device according to an embodiment of the present invention.

In FIG. 7C, a light shielding layer 104e is formed between an anode pad 120e and a cathode pad 122e. Since the light shielding layer 104e is made of a metal material, light emitted from the LED chip 200 does not transmit through the light shielding layer 104e. Therefore, the area of the light transmitting region 500e can be adjusted by changing the size of the light shielding layer 104e. That is, the area of the light transmitting region 500e can be reduced by increasing the width or length of the light-shielding layer 104e or increasing the number of the light shielding layers 104e. On the contrary, the area of the light transmitting region 500e can be increased by reducing the width or length of the light shielding layer 104e or reducing the number of the light shielding layers 104e.

Further, the light shielding layer 104e provided in the light transmitting region 500e is in a floating state in which it is not electrically connected to the pixel circuits of the LED chip 200 and the pixel 212. The light shielding layer 104e can also be called a dummy pattern provided in the light transmitting region 500e of the LED chip 200. As shown in FIG. 2, the light-shielding layer 104e, which is the dummy pattern, can be provided between the first wiring layer 108 and the substrate 102. The light-shielding layer 104e, which is the dummy pattern, is a layer different from any of the first wiring layer 108, the second wiring layer 116, and the semiconductor layer 112 forming the pixel circuit. Therefore, it is unlikely that a short circuit between wirings occurs in the pixel circuit due to the formation of the light shielding layer 104e, which is the dummy pattern. Further, the light-shielding layer 104e provided independently of the other layers can be formed in various shape patterns, and the degree of freedom in the shape of the light shielding layer 104e is high.

Furthermore, the light shielding layer 104e may be provided only in the light transmitting region 500e and may be formed only in a region that does not overlap the pixel circuit excluding the LED chip 200, or may overlap a part of the pixel circuit.

Figure 7D:
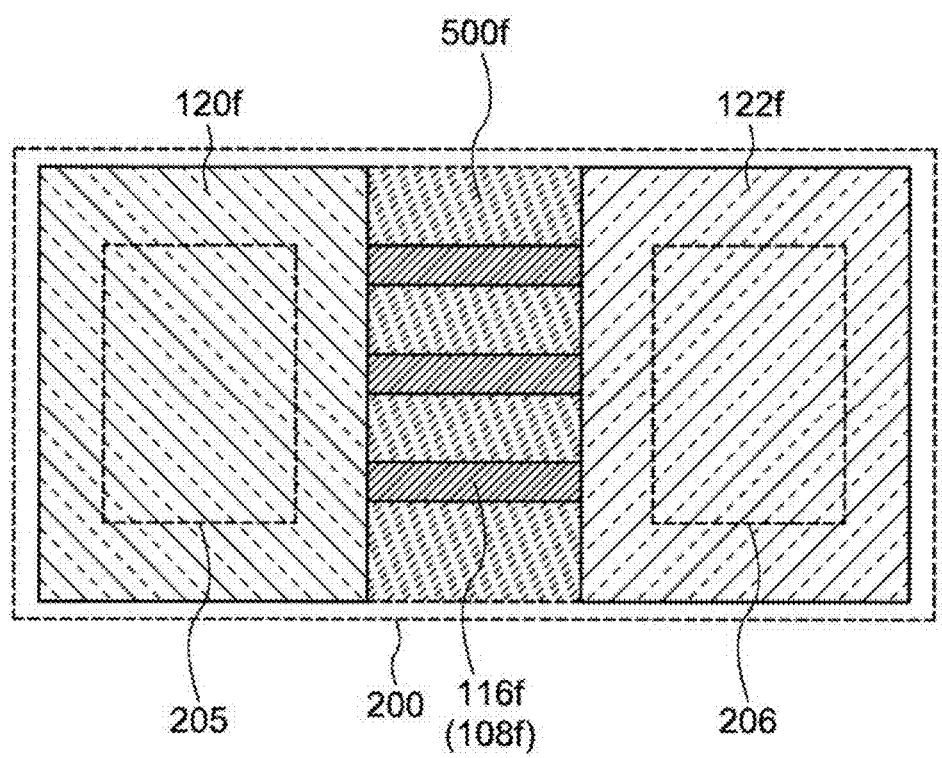
FIG. 7D is a schematic plan view showing a light transmission region with an adjusted area in a display device according to an embodiment of the present invention.

In FIG. 7D, a second wiring layer 116f is formed between an anode pad 120f and a cathode pad 122f. Since the second wiring layer 116f is made of a metal material, the light emitted from the LED chip 200 does not transmit through the second wiring layer 116f. Therefore, the area of the light transmitting region 500f can be adjusted by changing the size of the second wiring layer 116f. That is, the area of the light transmitting region 500f can be reduced by increasing the width or length of the second wiring layer 116f or increasing the number of the second wiring layers 116f. On the contrary, the area of the light transmitting region 500f can be increased by reducing the width or length of the second wiring layer 116f or reducing the number of the second wiring layers 116f.

In adjusting the area of the light transmitting region 500f, the first wiring layer 108f may be used instead of the second wiring layer 116f. The second wiring layer 116f or the first wiring layer 108f provided in the light transmitting region 500f are not electrically connected to the pixel circuits of the LED chip 200 and the pixel 212, and can also be called a dummy pattern in a floating state.

Further, the second wiring layer 116f or the first wiring layer 108f, which is the dummy pattern, may protrude from the second wiring layer 116 or the first wiring layer 108 forming the pixel circuit to the light transmitting region 500f in order to adjust the area of the light transmitting region 500f. Furthermore, the second wiring layer 116f or the first wiring layer 108f, which is a dummy pattern, may be adjusted by increasing or decreasing a part of the wiring width of the second wiring layer 116 or the first wiring layer 108 forming the pixel circuit.

In the display device 10 according to the present embodiment, the light emitted from the LED chip 200 can be extracted from the circuit substrate 100 side. That is, the light transmitted through the light transmitting region 500 of the circuit substrate 100 is emitted from the circuit substrate 100 side. At that time, since the area of the light transmitting region 500 of each of the plurality of pixels is adjusted to be constant, light emission having uniform brightness can be obtained from each pixel. Therefore, in the following description, the adjustment of the area of the light transmitting region 500 in the plurality of pixels is described with reference to FIGS. 8A to 8C.

Figure 8A:
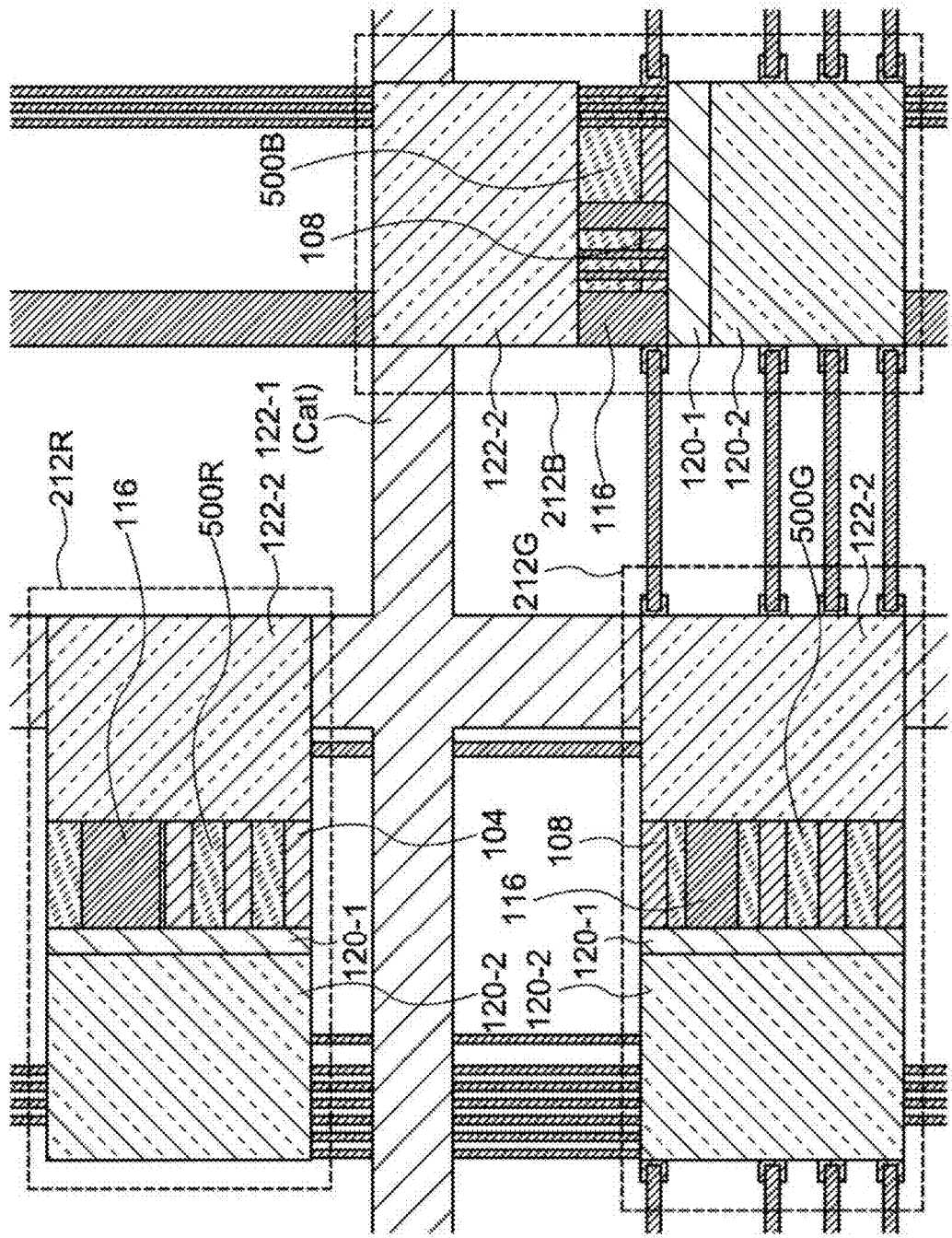
FIG. 8A is a schematic plan view showing three pixels included in a display portion of a circuit substrate in a display device according to an embodiment of the present invention.
Figure 8B:
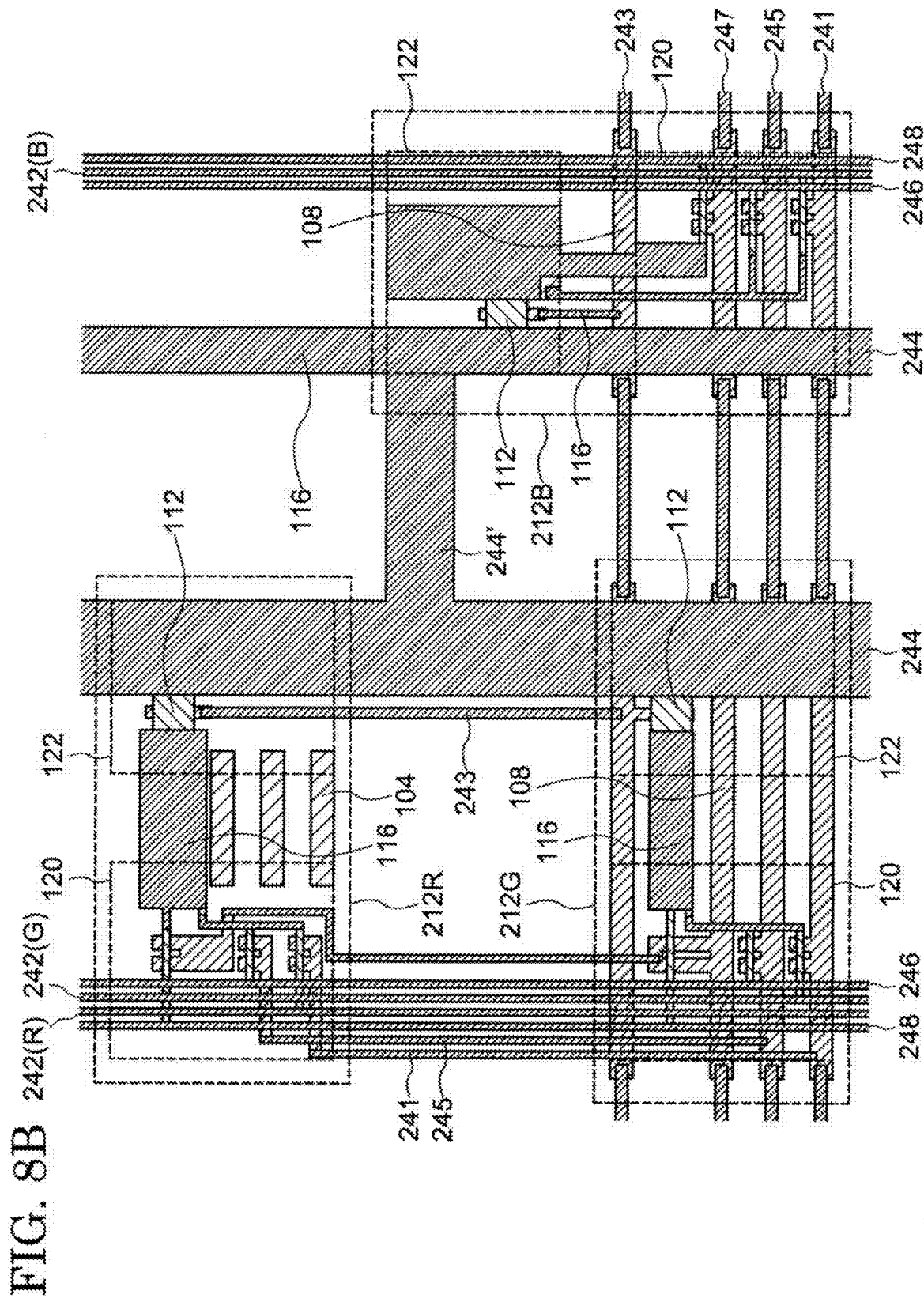
FIG. 8B is a schematic plan view showing three pixels included in a display portion of a circuit substrate in a display device according to an embodiment of the present invention.
Figure 8C:
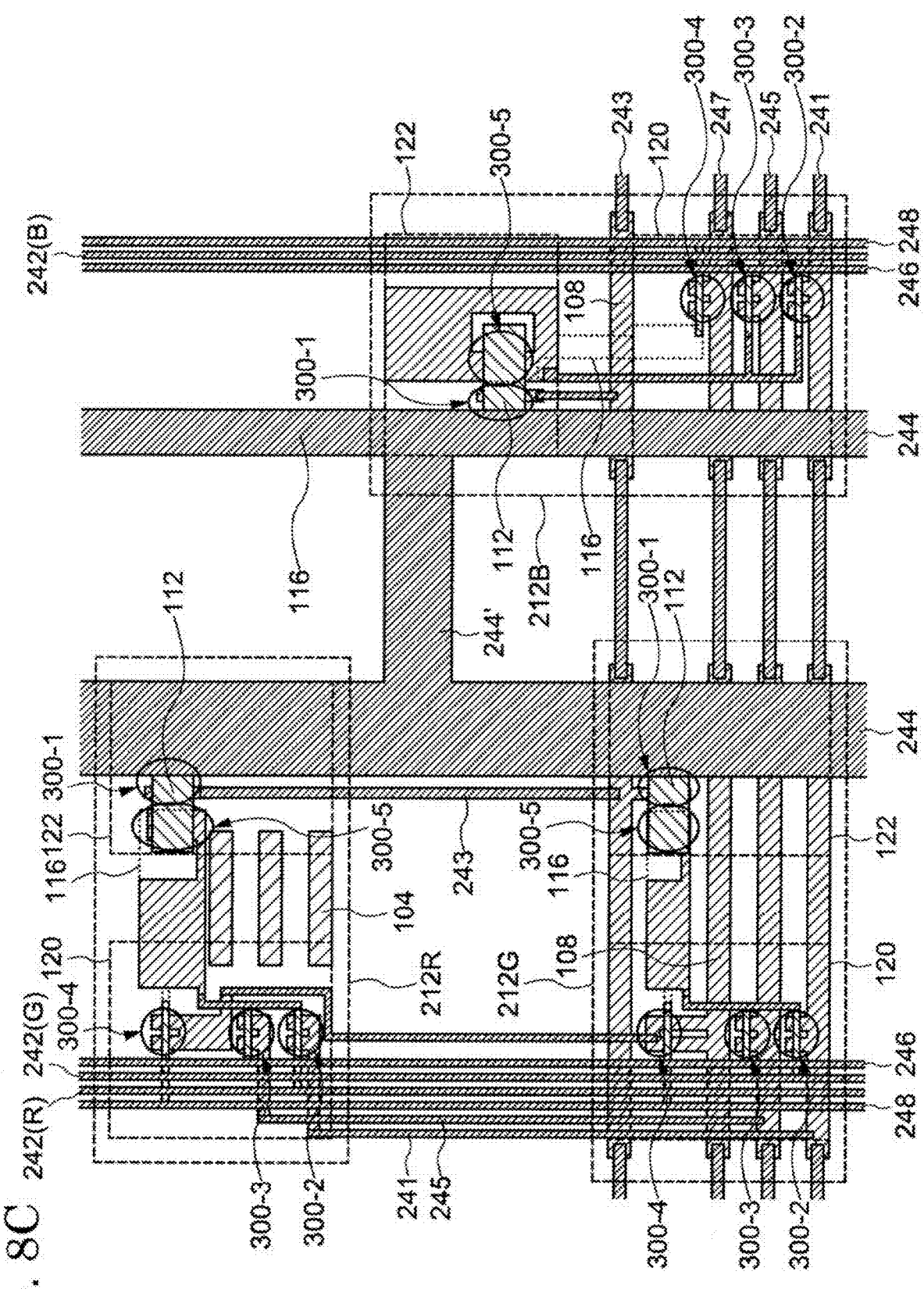
FIG. 8C is a schematic plan view showing three pixels included in a display portion of a circuit substrate in a display device according to an embodiment of the present invention.

FIGS. 8A to 8C are schematic plan views showing three pixels 212 included in the display portion 210 of the circuit substrate 100 in the display device 10 according to the embodiment of the present invention. The display portion 210 includes the first pixel 212R, the second pixel 212G, and the third pixel 212B as the three pixels 212. In FIGS. 8A to 8C, the description of the opening connecting the lower layer and the upper layer is omitted. In FIGS. 8A to 8C, the opening can be provided in a portion where an end portion of the lower layer and the end portion of the upper layer overlap each other, a portion where the end portion of the lower layer and the upper layer overlap each other, or a portion where the lower layer and the end portion of the upper layer overlap each other.

As shown in FIG. 8A, each of the first pixel 212R, the second pixel 212G, and the third pixel 212B includes the anode pad 120 and the cathode pad 122. The anode pad 120 includes the first electrode layer 120-1 and the second electrode layer 120-2. Further, the cathode pad 122 includes the third electrode layer 122-1 and the fourth electrode layer 122-2. Here, the first electrode layer 120-1 and the third electrode layer 122-1 are formed of a metal material that does not transmit visible light, and the second electrode layer 120-2 and the fourth electrode layer 122-2 are formed of a transparent conductive material that transmits visible light. Further, the light shielding layer 104, the first wiring layer 108, and the second wiring layer 116 are described as being formed of a metal material that does not transmit visible light.

The first electrode layer 120-1 is larger than the second electrode layer 120-2 and includes a portion (protruding portion) protruding from the end portion of the second electrode layer 120-2 in the direction of the cathode pad 122. Therefore, the first pixel 212R includes a first light transmitting region 500R which has an adjusted area by the first electrode layer 120-1 between the anode pad 120 and the cathode pad 122. Similarly, the second pixel 212G includes a second light transmitting region 500G, and the third pixel 212B includes a third light transmitting region 500B.

The size of the protruding portion of the first electrode layer 120-1 may be different between the first pixel 212R, the second pixel 212G, and the third pixel 212B. By adjusting the size of the protruding portion, the areas of the first light transmitting region 500R, the second light transmitting region 500G, and the third light transmitting region 500B can be adjusted.

The first pixel 212R includes the light shielding layer 104 and the second wiring layer 116 between the first electrode layer 120-1 and the cathode pad 122. Therefore, the light emitted from the first LED chip 200R mounted in the first pixel 212R is shielded by the light shielding layer 104 and the second wiring layer 116. Therefore, the first light transmitting region 500R is a region where the light shielding layer 104 and the second wiring layer 116 are excluded from the region that is located between the anode pad 120 (specifically, the first electrode layer 120-1) and the cathode pad 122 and overlaps the first LED chip 200R. That is, the first transmitting region 500R includes a plurality of regions separated by the light shielding layer 104 and the second wiring layer 116.

The second pixel 212G includes the first wiring layer 108 and the second wiring layer 116 between the first electrode layer 120-1 and the cathode pad 122. Therefore, the light emitted from the second LED chip 200G mounted in the second pixel 212G is shielded by the first wiring layer 108 and the second wiring layer 116. Therefore, the second light transmitting region 500G is a region where the first wiring layer 108 and the second wiring layer 116 are excluded from the region that is located between the anode pad 120 (specifically, the first electrode layer 120-1) and the cathode pad 122 and overlaps the first LED chip 200G. That is, the second transmitting region 500G includes a plurality of regions separated by the first wiring layer 108 and the second wiring layer 116.

The third pixel 212B includes the first wiring layer 108 and the second wiring layer 116 between the first electrode layer 120-1 and the cathode pad 122. Therefore, the light emitted from the third LED chip 200B mounted in the third pixel 212B is shielded by the first wiring layer 108 and the second wiring layer 116. Therefore, the third light transmitting region 500B is a region where the first wiring layer 108 and the second wiring layer 116 are excluded from the region that is located between the anode pad 120 (specifically, the first electrode layer 120-1) and the cathode pad 122 and overlaps the first LED chip 200B. That is, the third transmitting region 500G includes a plurality of regions separated by the first wiring layer 108 and the second wiring layer 116.

In order to match the brightness of the transmitted light of the first light transmitting region 500R with the brightness of the transmitted light of the second light transmitting region 500G, it is preferable that the first area ($S_1$) of the first light transmitting region 500R and the second area ($S_2$) of the second light transmitting region 500G have a first ratio that is represented by $S_1:S_2=1:0.8$ to 1.2 (equal to or greater than 0.8 and equal to or less than 1.2). More preferably, the first ratio is represented by 1:0.9 to 1.1 (equal to or greater than 0.9 and equal to or less than 1.1). In addition, in order to match the brightness of the transmitted light of the first light transmitting region 500R with the brightness of the transmitted light of the third light transmitting region 500B, it is preferable that the first area ($S_1$) of the first light transmitting region 500R and the third area ($S_3$) of the third light transmitting region 500B have a second ratio that is represented by $S_1:S_3=1:0.8$ to 1.2 (equal to or greater than 0.8 and equal to or less than 1.2). More preferably, the second ratio is represented by 1:0.9 to 1.1 (equal to or greater than 0.9 and equal to or less than 1.1). When the first ratio and the second ratio are in the above range, the brightness of the light emitted from each pixel 212 is constant. Therefore, the variation in brightness can be suppressed in the display device 10.

The first area, the second area, and the third area can be adjusted by changing not only the size of the first electrode layer 120-1, but also the width or the number of the light shielding layers 104, the first wiring layers 108, and the second wiring layers 116.

FIG. 8B is a plan view in which the cathode line Cat is omitted and the anode pad 120 and the cathode pad 122 are transparent in FIG. 8A in order to visualize the structure below the anode pad 120 and the cathode pad 122. Further, FIG. 8C is a plan view in which the second wiring layer 116 provided between the anode pad 120 and the cathode pad 122 is transparent in FIG. 8B in order to visualize the positions of the transistors 300.

As shown in FIGS. 8B and 8C, the transistor 300 (see FIGS. 2 and 5) included in each of the first pixel 212R, the second pixel 212G, and the third pixel 212B is a bottom gate type transistor. By providing the light shielding layer 104 below the first wiring layer 108 that functions as the gate electrode of the transistor 300, the first area, the second area, or the third area can be adjusted regardless of the arrangement of the transistors 300. That is, the light shielding layer 104 can be provided without overlapping the fifth transistor 300-5 and the first capacitance element 310 (see FIG. 5) as shown in the first pixel 212R of FIGS. 8B and 8C. Further, the light shielding layer 104 can be provided overlapping the fifth transistor 300-5 and the first capacitance element 310. Furthermore, the potential of the light shielding layer 104 may be in a floating state.

When the transistor 300 is a bottom gate type transistor, the semiconductor layer 112 is preferably provided below the first electrode layer 120-1 or the third electrode layer 122-1 as shown in FIGS. 8A to 8C. Since the first electrode layer 120-1 or the third electrode layer 122-1 blocks light emitted from the LED chip 200, the driving of the transistor 300 is stable.

In FIGS. 8A to 8C, the scanning line and the signal line extend in the direction from the first pixel 212R toward the second pixel 212G, and the scanning line extends in the direction from the second pixel 212G toward the third pixel. Therefore, in the first transistor 300-1 of the first pixel 212R shown in FIG. 8C, the wiring branching from the scanning line extending in the direction from the first pixel 212R toward the second pixel 212G can be used as the gate electrode.

As shown in FIG. 8A, the third electrode layer 122-1 of the cathode pad 122 may be shared by the first pixel 212R, the second pixel 212G, and the third pixel 212B. In the following description, for convenience, the wiring of the same layer as the third electrode layer 122-1 may be described as a wiring 122-1.

The wiring 122-1 may be provided along the current supply line 244 (see FIG. 5). For example, the wiring 122-1 may correspond to the cathode line Cat shown in FIG. 4. In the display portion 210, the wiring 122-1 overlaps the current supply line 244 (see FIGS. 5 and 8B) of the first pixel 212R and the second pixel 212G, extends parallel to the current supply line 244, and extends outside the display portion 210. Further, the wiring 122-1 (cathode line Cat) may be connected to the cathode pad 122 of the third pixel 212B and may have a structure formed in a grid pattern in the display portion 210. The wiring 122-1 (cathode line Cat) is formed along the current supply line 244 of the first pixel 212R and the second pixel 212G as shown in FIG. 8A. Further, the wiring 122-1 (cathode line Cat) is not formed along the current supply line 244 (see FIG. 8B) of the third pixel 212B although the wiring 122-1 (cathode line Cat) intersects the current supply line 244 of the third pixel 212B. However, a structure may be such that the wiring 122-1 (cathode line Cat) extends along the current supply line 244 of the third pixel 212B.

In FIGS. 8B and 8C, the first pixel 212R, the second pixel 212G, and the third pixel 212B are shown by dotted lines. Further, the anode pads 120 and the cathode pads 122 of the first pixel 212R, the second pixel 212G, and the third pixel 212B are shown by dotted lines. As shown in FIGS. 8B and 8C, the anode pad 120 and the cathode pad 122 are provided in the first pixel 212R. The same structure can apply to the second pixel 212G and the third pixel 212B.

FIG. 5 corresponds to the layout of the first pixel 212R shown in FIGS. 8B and 8C, and the description of overlapping content is omitted. As shown in FIG. 8C, the first transistor 300-1 and the fifth transistor 300-5 of the first pixel 212R overlap the cathode pad 122. Similarly, the second transistor 300-2, the third transistor 300-3, and the fourth transistor 300-4 overlap the anode pad 120. That is, all five transistors 300 provided in the pixel circuit are covered by the anode pad 120 or the cathode pad 122. With this structure, the light extracted from the circuit substrate 100 side of the LED chip 200 is shielded by the anode pad 120 and the cathode pad 122, so that the light does not transmit through the transistors 300 included in the pixel circuit. Therefore, it is possible to suppress the deterioration of the transistor characteristics due to light irradiation. Further, since only the wiring constituting the pixel circuit is used except for the region where the LED chip 200 of the circuit substrate 100 is mounted, the degree of freedom in layout is high. In addition, the transparency of the circuit substrate 100 when viewed from the front side or back side (circuit substrate side) of the transparent LED display device does not deteriorate.

Here, the transparent LED display device is described. The transparent LED display device is a display device in which the background on the back side can be visually recognized when viewed from the front side, and the background on the front side can be visually recognized when viewed from the back side. In the transparent LED display device, the transparency of the circuit substrate 100 is important. Here, the front side is, for example, the LED chip 200 side, and the back side is, for example, the circuit substrate 100 side. In addition to forming all the transistors 300 included in the pixel circuit of the pixel 212 so as to overlap the anode pad 120 or the cathode pad 122 of the circuit substrate 100 as shown in FIGS. 8A to 8C, various wirings included in the pixel circuit are consolidated and the area of the transparent region is increased, so that the transparency of the circuit substrate 100 as a whole can be improved. For example, as shown in FIGS. 8B and 8C, the scanning line 241 and the initialization scanning line 245, the reset scanning line 247, and the emission control scanning line 243 each extend in parallel in the first direction X and are arranged at regular intervals in the second direction Y. Similarly, the reset line 248, the signal line 242, the initialization line 246, and the current supply line 244 each extend in parallel in the second direction Y and are arranged at regular intervals in the first direction X. The wiring 122-1 (cathode line Cat) shown in FIG. 8A extends in the first direction X and the second direction Y. Since the first pixel 212R is provided at a position separated from the scanning line 241, the initialization scanning line 245, the reset scanning line 247, and the emission control scanning line 243 extending in the first direction X as shown in FIGS. 8B and 8C, a drawn wiring extending toward the second direction Y can be used to connect to four scanning lines.

In the first pixel 212R, the second transistor 300-2, the third transistor 300-3, and the fourth transistor 300-4 have constant intervals in the second direction Y and are arranged in this order. The same structure is applied to the second pixel 212G and the third pixel 212B. The second transistor 300-2, the third transistor 300-3, and the fourth transistor 300-4 of each pixel 212 are all located below the anode pad 120 of each pixel 212 and are shielded from light by the anode pad 120. That is, it can be rephrased that the second transistor 300-2, the third transistor 300-3, and the fourth transistor 300-4 are all formed inside the outer periphery of the anode pad 120 and do not extend beyond the anode pad 120.

In the first pixel 212R, the first transistor 300-1 and the fifth transistor 300-5 have a certain interval in the first direction X and are arranged in this order. The same structure is applied to the second pixel 212G. On the other hand, in the third pixel, although the first transistor 300-1 and the fifth transistor 300-5 are arranged at a regular interval in the first direction X, the order of arrangement is the opposite to the first pixel 212R and the second pixel 212G. That is, in the third pixel, the fifth transistor 300-5 and the first transistor 300-1 are arranged in this order in the first direction X. However, both the first transistor 300-1 and the fifth transistor 300-5 of each pixel 212 are located below the cathode pad 122 of each pixel 212 and are shielded from light by the cathode pad 122. That is, it can be rephrased that the first transistor 300-1 and the fifth transistor 300-5 are both formed inside the outer periphery of the cathode pad 122 and do not extend beyond the cathode pad 122.

Here, the reset line 248, the first pixel signal line 242(R), the second pixel signal line 242(G), and the initialization line 246, which overlap the first pixel 212R and the second pixel 212G, are defined as a first signal line group, and the reset line 248, the third pixel signal line 242(B), and the initialization line 246, which overlap the third pixel 212B, are defined as a second signal line group. The current supply line 244 is located between the first signal line group and the second signal line group. The current supply line 244 connected to the first pixel 212R and the second pixel 212G is formed to be thicker (larger) than the current supply line 244 connected to the third pixel 212B. By configuring the current supply line 244 in this way, for example, when there is a difference in the characteristics (luminous efficiency) of the LED chips 200 mounted in the first pixel 212R and the second pixel 212G and the LED chip 200 mounted in the third pixel 212B, the difference in characteristics between the LED chips 200 is reduced by decreasing the resistance value of the current supply line 244 on the side where the LED chip 200 has lower characteristics. Further, the current supply line 244 connected to the first pixel 212R and the second pixel 212G and the current supply line 244 connected to the third pixel 212B are connected to each other via the connection portion 244'. By providing the current supply line 244 between the first signal line group and the second signal line group, the wiring layout can be efficiently designed.

For example, a red LED chip as the first LED chip 200R, a green LED chip as the second LED chip 200G, and a blue LED chip as the third LED chip 200B can be mounted in the first pixel 212R, the second pixel 212G, and the third pixel 212B, respectively. In this case, red light emission is obtained from the first pixel 212R, green light emission is obtained from the second pixel 212G, and blue light emission is obtained from the third pixel 212B. According to the display device 10 according to the present embodiment, the area ratio of the first light transmitting region 500R, the second light transmitting region 500G, and the third light transmitting region 500B through which each of the red emission, the green emission, and the blue emission is transmitted is adjusted, so that the brightness of the red light emission, the green light emission, and the blue light emission extracted from the circuit substrate 100 side becomes constant. Therefore, the display device 10 can perform display in which the color balance is adjusted and the variation in luminance is suppressed. Further, when the display device 10 emits light on both sides, it is possible to display with a small difference in display quality on both sides.

Second Embodiment

An arrangement of the pixels 212 in the display portion 210 of the display device 10 according to an embodiment of the present invention is described with reference to FIG. 9.

Figure 9:
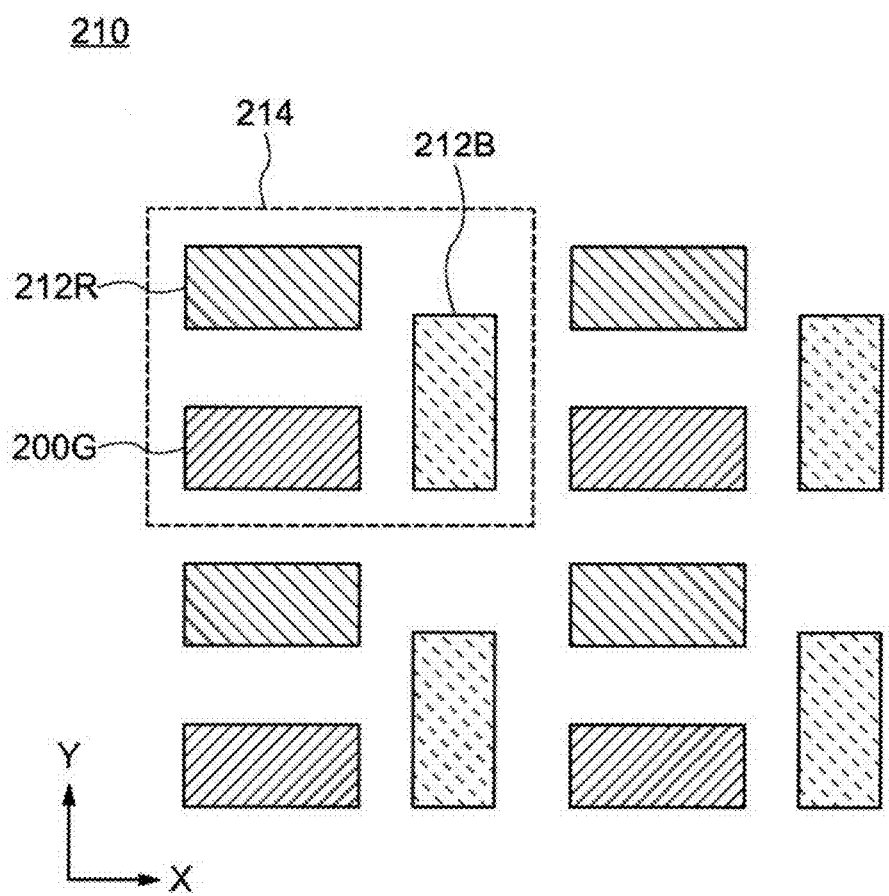
FIG. 9 is a schematic plan view showing an arrangement of pixels in a display portion of a display device according to an embodiment of the present invention.

FIG. 9 is a schematic plan view showing an arrangement of pixels 212 in the display portion 210 of the display device 10 according to the embodiment of the present invention. Specifically, FIG. 9 shows a part of the pixels 212 of the display portion 210 of the display device 10.

As shown in FIG. 9, the display portion 210 includes a first pixel 212R, a second pixel 212G, and a third pixel 212B. Here, a red LED chip, a green LED chip, and a blue LED chip are mounted in each of the first pixel 212R, the second pixel 212G, and the third pixel 212B, and red light emission is obtained from the first pixel 212R, green light emission is obtained from the second pixel 212G, and blue light emission is obtained from the third pixel 212B.

Each of the first pixel 212R, the second pixel 212G, and the third pixel 212B is a rectangle having long sides and short sides. The first pixel 212R is arranged so that the long side of the rectangle is in the X direction and the short side of the rectangle is in the Y direction. The second pixel 212G is arranged so that the long side of the rectangle is in the X direction and the short side of the rectangle is in the Y direction. The third pixel 212B is arranged so that the long side of the rectangle is in the Y direction and the short side of the rectangle is in the X direction. When the display portion 210 is rectangular, for example, the X direction is the long side direction of the rectangle of the display portion 210, and the Y direction is the short side direction of the rectangle of the display portion 210.

The shape of the pixel 212 is not limited to a rectangle. The shape of the pixel 212 may be, for example, an ellipse. When the shape of the pixel 212 is other than a rectangle, the long side and the short side described above may be the longest side or the long axis and the shortest side or the short axis, respectively.

In the display portion 210, the first pixels 212R and the second pixels 212G are alternately arranged in the Y direction. Further, in the display portion 210, the first pixels 212R or the second pixels 212G and the third pixel 212B are alternately arranged in the X direction.

Further, in the display portion 210, the first unit 214 including one first pixel 212R, one second pixel 212G, and one third pixel 212B can be repeatedly arranged in the X direction and the Y direction. In the first unit 214, the first pixel 212R and the second pixel 212G are arranged adjacent to each other in the Y direction, and the first pixel 212R or the second pixel 212G and the third pixel 212B are arranged adjacent to each other in the X direction. Further, the third pixel 212B is arranged at a position closer to the second pixel 212G than the first pixel 212R. The third pixel 212B may be arranged at a position closer to the first pixel 212R than the second pixel 212G, or may be arranged at an intermediate position between the first pixel 212R and the second pixel 212G.

When full lighting display (all white display) was performed on the display portion 210, it was confirmed that the display quality was good.

Modification 1

An arrangement of the pixels 212 in the display portion 210a different from the display portion 210 is described with reference to FIG. 10.

Figure 10:
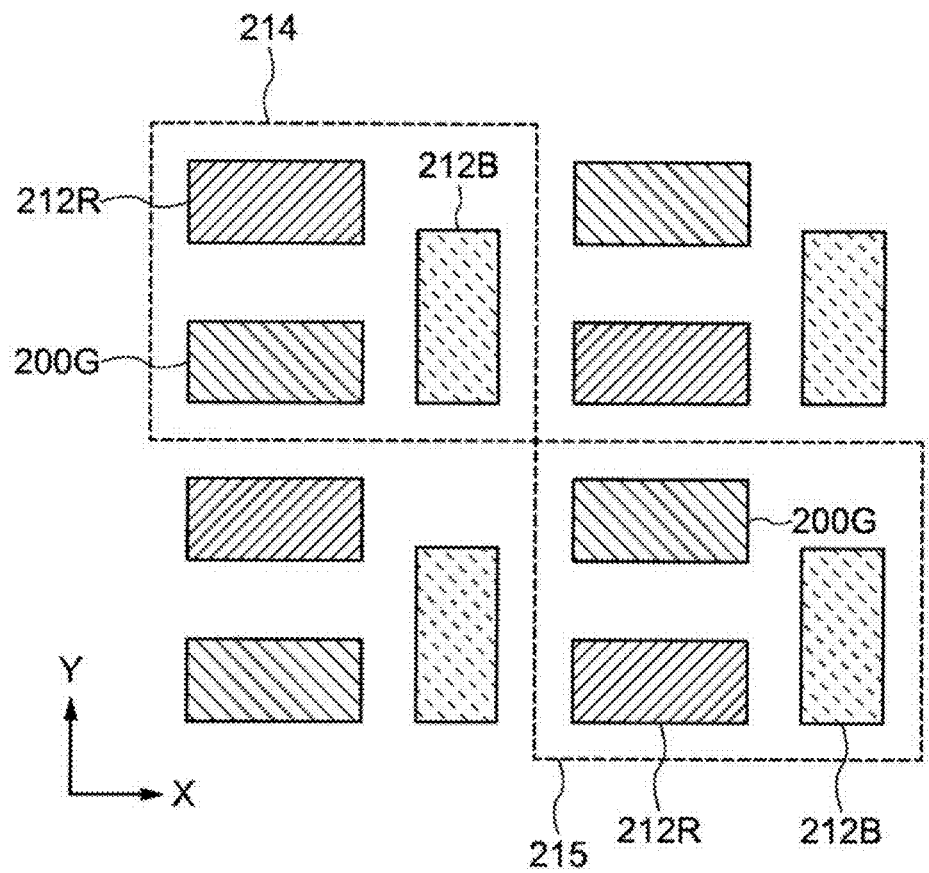
FIG. 10 is a schematic plan view showing an arrangement of pixels in a display portion of a display device according to an embodiment of the present invention.

FIG. 10 is a schematic plan view showing an arrangement of pixels 212 in the display portion 210a of the display device 10 according to the embodiment of the present invention. Specifically, FIG. 10 shows a part of the pixels 212 of the display portion 210a of the display device 10. In this modification as well, red light emission is obtained from the first pixel 212R, green light emission is obtained from the second pixel 212G, and blue light emission is obtained from the third pixel 212B. Further, in the description of the display portion 210a according to the modification, the description of the same configuration as the display portion 210 is omitted.

The display portion 210a includes a first unit 214 and a second unit 215. The second unit 215 has a configuration in which the position of the first pixel 212R and the position of the second pixel 212G in the first unit 214 are interchanged. In the display portion 210a, the first unit 214 and the second unit 215 are alternately and repeatedly arranged in the X direction. Further, in the display portion 210a, the first unit 214 is repeatedly arranged in the Y direction, and the second unit 215 adjacent to the first unit 214 is also repeatedly arranged in the Y direction.

When full lighting display (all white display) was performed on the display portion 210a, the screen appeared rough. However, the roughness at an end portion of the display portion 210a was not confirmed.

Comparative Example 1

An arrangement of the pixels 212 in the display portion 210b different from the display portion 210 is described with reference to FIG. 11.

Figure 11:
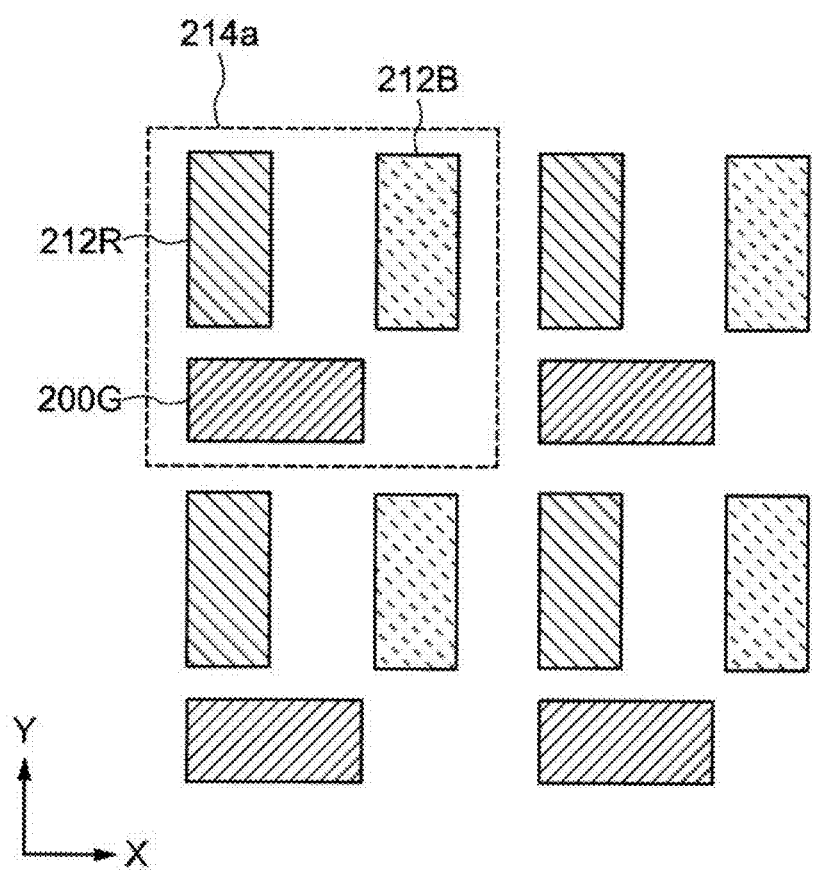
FIG. 11 is a schematic plan view showing an arrangement of pixels in a display portion of a display device according to an embodiment of the present invention.

FIG. 11 is a schematic plan view showing an arrangement of pixels 212 in the display portion 210b of the display device 10 according to the embodiment of the present invention. Specifically, FIG. 11 shows a part of the pixels 212 of the display portion 210b of the display device 10. In this comparative example as well, red light emission is obtained from the first pixel 212R, green light emission is obtained from the second pixel 212G, and blue light emission is obtained from the third pixel 212B. Further, in the description of the display portion 210b according to the comparative example, the description of the same configuration as the display portion 210 is omitted.

In the display portion 210b, the first pixel 212R is arranged so that the long side of the rectangle is in the Y direction and the short side of the rectangle is in the X direction. The second pixel 212G is arranged so that the long side of the rectangle is in the X direction and the short side of the rectangle is in the Y direction. The third pixel 212B is arranged so that the long side of the rectangle is in the Y direction and the short side of the rectangle is in the X direction.

In the display portion 210b, the first pixel 212R and the third pixel 212B are alternately arranged in the X direction. Further, in the display portion 210, the first pixel 212R or the third pixel 212B and the second pixel 212G are alternately arranged in the Y direction.

Further, in the display portion 210b, a first unit 214a including one first pixel 212R, one second pixel 212G, and one third pixel 212B can be repeatedly arranged in the X direction and the Y direction. In the first unit 214a, the first pixel 212R and the third pixel 212B are arranged adjacent to each other in the X direction, and the first pixel 212R or the third pixel 212B and the second pixel 212G are arranged adjacent to each other in the Y direction. Further, the second pixel 212G is arranged at a position closer to the first pixel 212R than the third pixel 212B.

When full lighting display (all white display) was performed on the display portion 210b, the roughness of the pixel 212 appeared distinctly at the end portion in the Y direction.

Each of the embodiments described above as an embodiment of the present invention can be appropriately combined and implemented as long as they do not contradict each other. Additions, deletion, or design changes of constituent elements, or additions, omissions, or changes to conditions of steps as appropriate based on the respective embodiments are also included within the scope of the present invention as long as the gist of the present invention is provided.

Other effects which differ from those brought about by each of the embodiments described above, but which are apparent from the description herein or which can be readily predicted by those skilled in the art, are naturally understood to be brought about by the present invention.

What is claimed is:

1. A display device comprising:
   a circuit substrate; and
   an LED chip,
   wherein the circuit substrate comprises:
     a substrate;
     a light shielding layer over the substrate;
     a first insulating layer over the light shielding layer;
     a first wiring layer over the first insulating layer;
     a second insulating layer over the first wiring layer;
     an anode pad over the second insulating layer and electrically connected with the LED chip; and
     a cathode pad over the second insulating layer and electrically connected with the LED chip,
   wherein in a plan view, the light shielding layer is located between the anode pad and the cathode,
   wherein a pixel circuit comprising the first wiring layer and electrically connected to the anode pad does not overlap the light shielding layer,
   wherein the pixel circuit comprises at least a first transistor, a second transistor, a third transistor, a fourth transistor, and a fifth transistor,
   wherein each of the first transistor to the fifth transistor overlaps the anode pad or the cathode pad, and
   wherein:
     the first transistor is a light emission control transistor,
     the second transistor is a selection transistor,
     the third transistor is an initialization transistor,
     the fourth transistor is a reset transistor,
     the fifth transistor is a drive transistor,
     the first transistor and the fifth transistor are located inside an outer periphery of the cathode pad, and
     the second transistor, the third transistor, and the fourth transistor are located inside an outer periphery of the anode pad.

2. The display device according to claim 1,
   wherein the first wiring layer comprises a gate electrode, and
   the second insulating layer comprises a gate insulating layer.

* * * * *